(12) United States Patent
Okamura et al.

(10) Patent No.: US 9,298,094 B2
(45) Date of Patent: Mar. 29, 2016

(54) COMPOSITION FOR FORMING FINE PATTERN AND METHOD FOR FORMING FINED PATTERN USING SAME

(75) Inventors: Toshira Okamura, Shizuoka (JP); Georg Pawlowski, Shizuoka (JP); Masahiro Ishii, Shizuoka (JP)

(73) Assignee: MERCK PATENT GMBH, Darmstadt (DE)

( * ) Notice: Subject to any disclaimer, the term of this patent is extended or adjusted under 35 U.S.C. 154(b) by 47 days.

(21) Appl. No.: 14/127,331

(22) PCT Filed: Jul. 13, 2012

(86) PCT No.: PCT/JP2012/067926
§ 371 (c)(1),
(2), (4) Date: Dec. 18, 2013

(87) PCT Pub. No.: WO2013/008912
PCT Pub. Date: Jan. 17, 2013

(65) Prior Publication Data
US 2014/0127478 A1  May 8, 2014

(30) Foreign Application Priority Data

Jul. 14, 2011 (JP) ................. 2011-155822

(51) Int. Cl.
| | | |
|---|---|---|
| *C08F 226/02* | (2006.01) | |
| *G03F 7/32* | (2006.01) | |
| *H01L 21/027* | (2006.01) | |
| *G03F 7/40* | (2006.01) | |
| *C09D 139/00* | (2006.01) | |
| *C08F 226/04* | (2006.01) | |
| *C08F 8/28* | (2006.01) | |
| *C08F 8/30* | (2006.01) | |
| *C08F 8/34* | (2006.01) | |

(52) U.S. Cl.
CPC ... *G03F 7/32* (2013.01); *C08F 8/28* (2013.01); *C08F 8/30* (2013.01); *C08F 8/34* (2013.01); *C08F 226/02* (2013.01); *C08F 226/04* (2013.01); *C09D 139/00* (2013.01); *G03F 7/405* (2013.01); *H01L 21/0273* (2013.01); *C08F 2800/10* (2013.01); *C08F 2810/30* (2013.01); *C08F 2810/50* (2013.01); *Y10T 428/24802* (2015.01)

(58) Field of Classification Search
CPC ........ G03F 7/40; C08F 226/02; C08F 226/04; C08F 26/00; C08F 26/02; C08F 26/04
See application file for complete search history.

(56) References Cited

U.S. PATENT DOCUMENTS

| | | | |
|---|---|---|---|
| 5,086,111 A * | 2/1992 | Pinschmidt et al. ............ 525/61 |
| 5,863,879 A * | 1/1999 | Zirnstein et al. ............. 510/360 |
| 7,399,582 B2 | 7/2008 | Takahashi et al. | |
| 7,595,141 B2 | 9/2009 | Kudo et al. | |
| 8,101,333 B2 | 1/2012 | Noya et al. | |
| 2005/0227492 A1 | 10/2005 | Hah et al. | |
| 2010/0021700 A1 * | 1/2010 | Noya et al. ................. 428/195.1 |
| 2010/0119717 A1 | 5/2010 | Hong et al. | |
| 2010/0119975 A1 | 5/2010 | Akashi et al. | |
| 2012/0156968 A1 * | 6/2012 | Kimura et al. .................. 451/36 |

FOREIGN PATENT DOCUMENTS

| | | |
|---|---|---|
| JP | 2005-301275 A | 10/2005 |
| JP | 2008-518260 A | 5/2006 |
| JP | 2006-307179 A | 11/2006 |
| JP | 2008-102348 A | 5/2008 |
| JP | 2008-275995 A | 11/2008 |
| JP | 2011-33679 A | 2/2011 |
| WO | WO 2005/008340 A1 | 1/2005 |
| WO | WO 2009/008265 A1 | 1/2009 |

* cited by examiner

*Primary Examiner* — Anca Eoff
(74) *Attorney, Agent, or Firm* — Mitchell Brustein

(57) ABSTRACT

The present invention provides a resist pattern-forming composition capable of forming a resist pattern excellent in etching resistance. The invention also provides a resist pattern formation method using that composition. The composition comprises pure water and a water-soluble resin having aromatic group-containing substituents in its side chain. The composition also contains a free acid or an acid group combined with the water-soluble resin.

18 Claims, No Drawings

COMPOSITION FOR FORMING FINE PATTERN AND METHOD FOR FORMING FINED PATTERN USING SAME

This application is a United States National Stage Patent Application under 35 U.S.C. §371 of International Patent Application Ser. No. PCT/JP2012/067926, filed Jul. 13, 2012, which claims priority to Japanese Patent Applications No. 2011-155822, filed Jul. 14, 2011, the contents of both documents being hereby incorporated herein by reference.

TECHNICAL FIELD

The present invention relates to a composition for forming a superfine pattern. Specifically, this invention relates to a superfine pattern-forming composition advantageously used in a developing process of a photosensitive resin composition employed for manufacture of semiconductor devices, flat panel displays (FPDs) such as liquid crystal displays, charge-coupled devices (CCDs), color filters, magnetic heads and the like. The invention also relates to a resist pattern formation method using the superfine pattern-forming composition.

BACKGROUND ART

Recently in manufacturing semiconductor devices, resist patterns have been required to be miniaturized enough to meet increased integration density and highly accelerated processing speed in LSIs. This requirement has led to design rules requiring quarter-micron- or finer-scale fabrication rather than half-micron-scale fabrication, which the design rules formerly required. For the purpose of advancing the miniaturization, researchers are making studies on photosensitive resins and light sources for exposure. For example, since conventional light for exposure such as visible light or near UV light (wavelength: 400 to 300 nm) cannot fully satisfy the design rules requiring finer fabrication, it is studied to use practically radiation of shorter wavelength such as X-rays, electron beams and far UV light emitted from a KrF excimer laser (248 nm), an ArF excimer laser (193 nm) or the like. On the other hand, there are also various studies on the photosensitive resin composition. However, hitherto, the miniaturization has mainly depended upon improvement of the exposure light source and the exposure method, and hence cannot have been satisfyingly advanced only by improving the photosensitive resin composition.

In view of that, a new method for miniaturizing resist patterns is studied from a very different viewpoint. Specifically, a method is disclosed in which a resist pattern formed by the conventional method is covered afterward with a layer of even thickness so as to thicken the pattern and thereby to decrease the diameter of contact holes and/or the width of lines among the ridges in the resist pattern (Patent document 1 and 2). However, in the disclosed method, there is room for improvement on the covering layer. That is, when the resist pattern is subjected to the etching procedure after covered with the layer, the layer can be so etched unfavorably that the resultant transferred pattern has a line width and/or a contact hole diameter not so miniaturized as expected. In order to avoid this problem, it is desirable that the covering layer have enough etching resistance.

[Patent document 1] Japanese Patent Laid-Open No. 2008-275995
[Patent document 2] Japanese Patent Laid-Open No. 2008-102348

DISCLOSURE OF INVENTION

Problem to be Solved by the Invention

With a view to the above problem, it is an object of the present invention to provide a superfine pattern-forming composition that enables to form a resist pattern excellent in etching resistance without increasing production cost nor lowering production efficiency. Further, it is another object of the invention to provide a resist pattern formation method using that superfine pattern-forming composition.

Means for Solving Problem

A first embodiment of the present invention resides in a composition for forming a superfine pattern, comprising pure water and a water-soluble resin represented by the following formula (1):

wherein
X, Y and Z are repeating units of

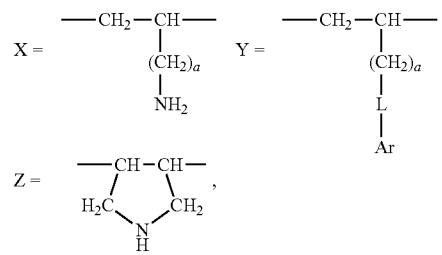

respectively;
p, q and r are numbers of polymerization ratios of said repeating units X, Y and Z, respectively, provided that they satisfy the conditions of $0.60 \leq p+r \leq 0.95$ and $0.05 \leq q \leq 0.40$ and that each repeating unit may combine with each other either randomly or to form a block;
a in said repeating unit X or Y is an integer of 0 or 1;
L in said repeating unit Y is a divalent linking group selected from the group consisting of
—N=CH—,
—NH—CHR$^0$—,
—NH—CH$_2$—CHR$^0$— and
—NH—CHR$^0$—CH$_2$—
where R$^0$ is selected from the group consisting of —H, —CH$_3$, —COOH, —CH$_2$COOH, —CH(CH$_3$)$_2$ and —COOC$_2$H$_5$;
Ar in said repeating unit Y is a group represented by the following formula:

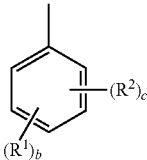

where b is an integer of 0 to 5; c is an integer of 0 to 5−b; R$^1$ is an organic group comprising elements selected from the group consisting of carbon, nitrogen, oxygen and fluorine; in the case where b is 2 or more, two R$^1$s may combine with each other to form a ring structure; and $R^2$ is an acid group selected from the group consisting of —COOH, —CH$_2$COOH, —CH(CH$_3$)COOH, —OCH$_2$COOH, —SO$_3$H and —OH;
said repeating unit Y contains at least one acid group; and each of said repeating units X and Y may be a combination of repeating units having different structures, respectively.

A second embodiment of the present invention resides in a composition for forming a superfine pattern, comprising pure water, an acid and a water-soluble resin represented by the following formula (1'):

  (1')

wherein
X, Y' and Z are repeating units of

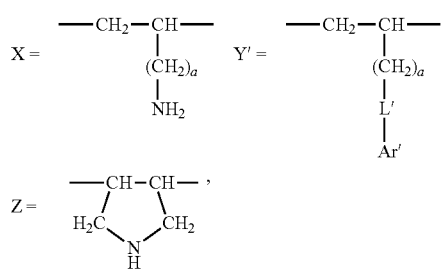

respectively;
p, q and r are numbers of polymerization ratios of said repeating units X, Y' and Z, respectively, provided that they satisfy the conditions of 0.60≤p+r≤0.95 and 0.05≤q≤0.40 and that each repeating unit may combine with each other either randomly or to form a block;
a in said repeating unit X or Y' is an integer of 0 or 1;
L' in said repeating unit Y' is a divalent linking group selected from the group consisting of
—N═CH—,
—NH—CHR$^{O'}$—,
—NH—CH$_2$—CHR$^{O'}$— and
—NH—CHR$^{O'}$—CH$_2$—
where R$^{O'}$ is selected from the group consisting of —H, —CH$_3$, —CH(CH$_3$)$_2$ and —COOC$_2$H$_5$;
Ar' in said repeating unit Y' is a group represented by the following formula:

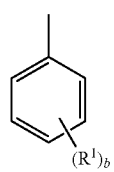

where b is an integer of 0 to 5; R$^1$ is an organic group comprising elements selected from the group consisting of carbon, nitrogen, oxygen and fluorine; and in the case where b is 2 or more, two R$^1$s may combine with each other to form a ring structure;
and
each of said repeating units X and Y' may be a combination of repeating units having different structures, respectively.

A third embodiment of the present invention resides in a composition for forming a superfine pattern, comprising pure water and a water-soluble resin; wherein said water-soluble resin is a product of the reaction of a backbone polymer represented by the following formula (2):

  (2)

in which
X$^0$ and Z$^0$ are repeating units of

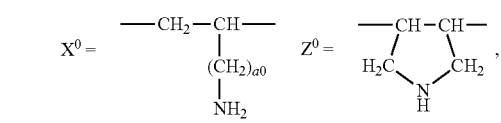

respectively;
p0 and r0 are numbers of polymerization ratios of said repeating units X$^0$ and Z$^0$, respectively, provided that they satisfy the conditions of 0.05≤p0≤1 and 0≤r0≤0.95 and that each repeating unit may combine with each other either randomly or to form a block;
a0 in said repeating unit X$^0$ is an integer of 0 or 1; and
said repeating unit X$^0$ may be a combination of repeating units having different a0 integers;
with
at least one side-chain forming compound represented by the following formula (3A) or (3B):

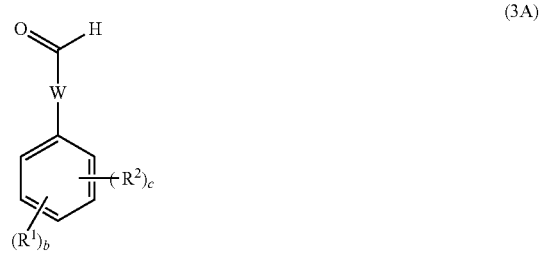  (3A)

  (3B)

in which b is an integer of 0 to 5; c is an integer of 0 to 5−b; W is a single bond or a divalent linking group selected from the group consisting of —CHR$^0$— and —CHR$^0$—CH$_2$— where R$^0$ is selected from the group consisting of —H, —CH$_3$, —CH(CH$_3$)$_2$, —COOH, —CH$_2$COOH, and —COOC$_2$H$_5$;
R$^1$ is an organic group comprising elements selected from the group consisting of carbon, nitrogen, oxygen and fluorine; in the case where b is 2 or more, two R$^1$s may combine with each other to form a ring structure; R$^2$ is an acid group selected from the group consisting of —COOH, —CH$_2$COOH, —CH(CH$_3$)COOH, —OCH$_2$COOH, —SO$_3$H and —OH; and W or R$^1$ includes at least one acid group;
so that
aromatic group-containing substituents derived from said side-chain forming compound are combined with to 40% of nitrogen atoms in said backbone polymer.

A fourth embodiment of the present invention resides in a composition for forming a superfine pattern, comprising pure water, an acid and a water-soluble resin; wherein said water-soluble resin is a product of the reaction of
a backbone polymer represented by the following formula (2):

$$-X^0{}_{p0}-Z^0{}_{r0}-\qquad(2)$$

in which
$X^0$ and $Z^0$ are repeating units of

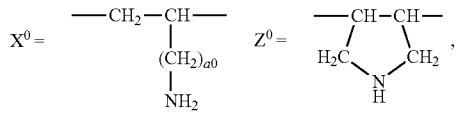

respectively;
p0 and r0 are numbers of polymerization ratios of said repeating units $X^0$ and $Z^0$, respectively, provided that they satisfy the conditions of $0.05 \le p0 \le 1$ and $0 \le r \le 0.95$ and that each repeating unit may combine with each other either randomly or to form a block;
a0 in said repeating unit $X^0$ is an integer of 0 or 1; and said repeating unit $X^0$ may be a combination of repeating units having different a0 integers;
with
at least one side-chain forming compound represented by the following formula (3A') or (3B'):

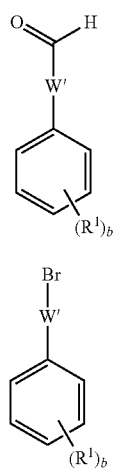

in which b is an integer of 0 to 5; W' is a single bond or a divalent linking group selected from the group consisting of —CHR⁰'— and —CHR⁰'—CH₂— where R⁰' is selected from the group consisting of —H, —CH₃ and —COOC₂H₅; R¹ is an organic group comprising elements selected from the group consisting of carbon, nitrogen, oxygen and fluorine; and in the case where b is 2 or more, two R¹s may combine with each other to form a ring structure;
so that
aromatic group-containing substituents derived from said side-chain forming compound are combined with 5 to 40% of nitrogen atoms in said backbone polymer.

The present invention also provides a method for forming a superfine resist pattern, comprising the step of treating a resist pattern after development with any one of the above superfine pattern-forming compositions so as to reduce the effective size of the resist pattern after the development.

The present invention further provides a fined resist pattern formed by the steps of developing an imagewise exposed resist substrate with a developer, and then
treating the developed resist substrate with any one of the above compositions for forming a superfine pattern.

Effect of the Invention

The superfine pattern-forming composition of the present invention enables to produce a superfine pattern without increasing the production cost nor impairing the production efficiency. The superfine pattern produced from the composition of the present invention has higher etching resistance and hence is more practical than resist patterns miniaturized by conventional methods.

BEST MODE FOR CARRYING OUT THE INVENTION

Embodiments according to the present invention are described below in detail.
Composition for Forming a Superfine Pattern
The superfine pattern-forming composition of the present invention comprises pure water and a particular water-soluble resin. It is one of the characteristics of the composition that the water-soluble resin contains a particular acid group or that the composition further comprises an acid.
(1) First Composition for Forming a Superfine Pattern
According to a first embodiment of the present invention, the superfine pattern-forming composition comprises pure water and a water-soluble resin represented by the following formula (1):

$$-X_p-Y_q-Z_r-\qquad(1)$$

wherein
X, Y and Z are repeating units of

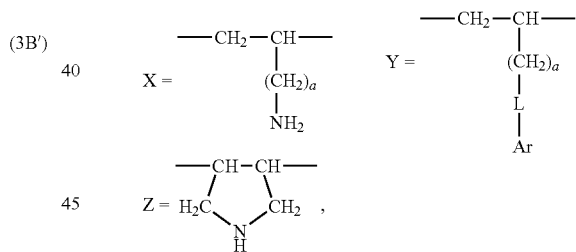

respectively;
p, q and r are numbers of polymerization ratios of the repeating units X, Y and Z, respectively, provided that they satisfy the conditions of $0.60 \le p+r \le 0.95$, preferably $0.80 \le p+r \le 0.95$ and $0.05 \le q \le 0.40$, preferably $0.05 \le q \le 0.20$ and that each repeating unit may combine with each other either randomly or to form a block;
a in the repeating unit X or Y is an integer of 0 or 1;
L in the repeating unit Y is a divalent linking group selected from the group consisting of
—N=CH—,
—NH—CHR⁰—,
—NH—CH₂—CHR⁰— and
—NH—CHR⁰—CH₂—
where R⁰ is selected from the group consisting of —H, —CH₃, —COOH, —CH₂COOH, —CH(CH₃)₂ and —COOC₂H₅;
Ar in the repeating unit Y is a group represented by the following formula:

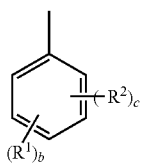

where b is an integer of 0 to 5, preferably 0 to 1; c is an integer of 0 to 5−b, preferably 1 to 2; $R^1$ is an organic group comprising elements selected from the group consisting of carbon, nitrogen, oxygen and fluorine; in the case where b is 2 or more, two $R^1$s may combine with each other to form a ring structure; and $R^2$ is an acid group selected from the group consisting of —COOH, —CH$_2$COOH, —CH(CH$_3$)COOH, —OCH$_2$COOH, —SO$_3$H and —OH, preferably —COOH or —SO$_3$H; the repeating unit Y contains at least one acid group; and each of the repeating units X and Y may be a combination of repeating units having different structures, respectively.

The first composition for forming a superfine pattern is characterized in that the water-soluble resin contains an acid group. This means that either or both of the linking group L and the substituent Ar in the repeating unit Y must contain an acid group such as —COOH, —SO$_3$H or phenolic-OH.

In the formula (1), each of the repeating units X and Y may be a combination of two or more repeating units having different integers (a), linking groups (L) and/or substituents (Ar). In the case where the repeating unit Y consists of two or more repeating units, it is good enough that at least one of them contains an acid group. It should be noted that the repeating unit Y must be present but either X or Z may be absent in the formula (1). In other words, either p or r in the formula (1) may be equal to 0. However, if the number r is not equal to 0, the resultant resin tends to have further improved etching resistance. The resin, therefore, preferably comprises the repeating unit Z.

The substituent Ar is an aromatic group which may have a substituent. The substituent Ar can have an acid group $R^2$ and independently can have another organic group $R^1$, which comprises elements selected from the group consisting of carbon, nitrogen, oxygen and fluorine. In the case where $R^1$ contains carbon, the number of carbon atoms is preferably 1 to 10. On the other hand, in the case where $R^1$ does not contain carbon, the group $R^1$ may be a fluorine atom or amino or otherwise may consist of oxygen and nitrogen atoms only. The group $R^1$ is preferably selected from the group consisting of alkyl, alkoxy, hydroxy alkyl, substituted amino, non-substituted amino, alkylether, alkylester, alkylamido, fluorine atom and fluorinated alkoxy, more preferably dimethylamino group. Preferred examples of Ar are as follows.

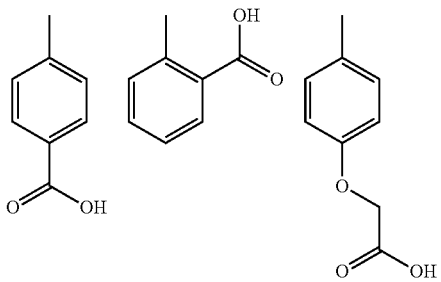

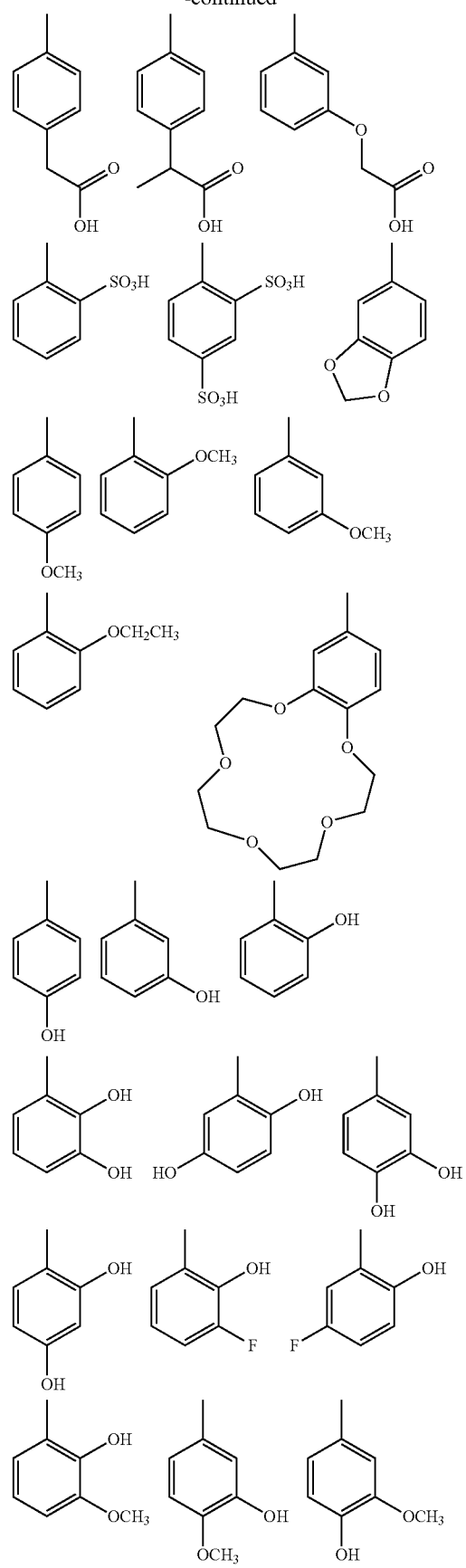

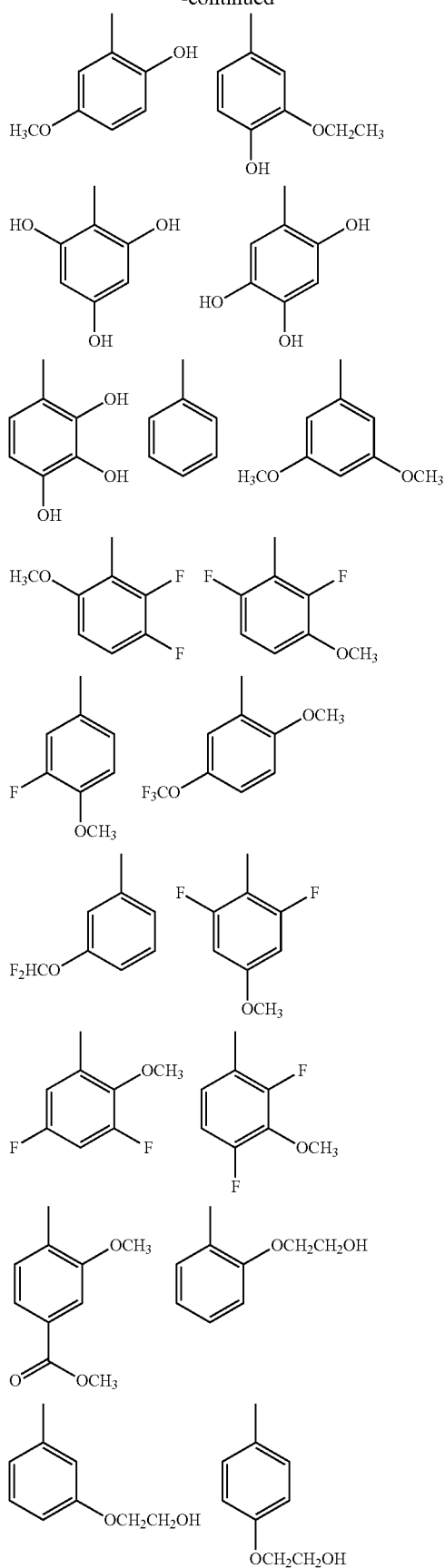
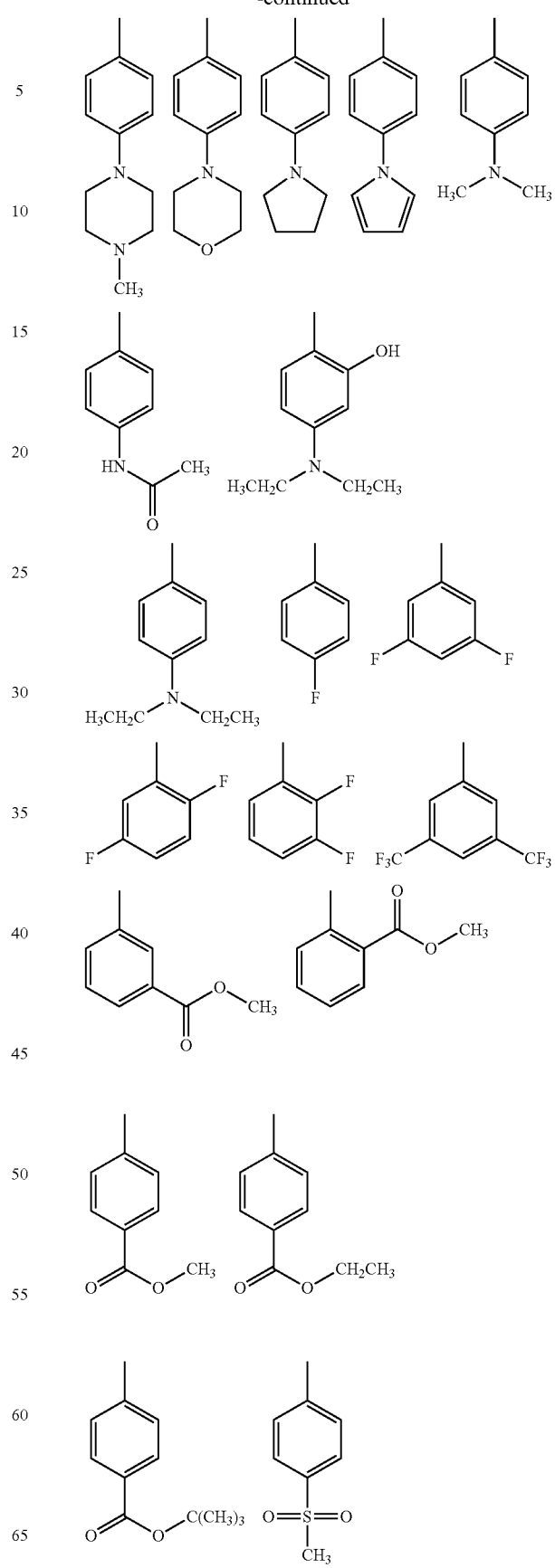

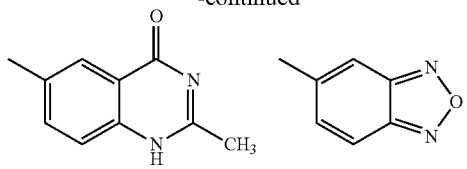

As described above, the first superfine pattern-forming composition contains the water-soluble resin comprising the repeating units X, Y and Z. However, the resin may further comprise other repeating units unless the effect of the present invention is impaired. For example, the resin may comprise a repeating unit that corresponds to Y but does not contain an acid group. (This means that the resin may comprise the repeating unit Y' described later.)

There is no particular restriction on the molecular weight of the water-soluble resin, but the weight average molecular weight thereof is generally 3000 to 100000, preferably 5,000 to 20,000. In the present invention, the term "weight average molecular weight" means a polystyrene-reduced weight average molecular weight determined by gel permeation chromatography.

The first composition according to the present invention comprises pure water and the water-soluble resin represented by the above formula (1). The concentration of the resin can be freely determined according to the kind of the resist, the aimed pattern size and the like, but is generally 0.1 to 10 wt %, preferably 1.0 to 7.0 wt %, based on the total weight of the composition.

The water-soluble resin in the first composition of the present invention must have an acid group, but in addition the composition may further comprises an acid independently. There is no particular restriction on the kind of the acid, as long as it does not give unfavorable effects to the resist pattern. However, the acid is preferably selected from the group consisting of nitric acid, sulfuric acid, acetic acid, benzenesulfonic acid, p-toluenesulfonic acid, 2-naphthalenesulfonic acid, 1,3-benzenedisulfonic acid, 1,5-naphthalenedisulfonic acid and 2,7-naphthalenedisulfonic acid. An isomer in which a substituent group is bond to a different position from the above mentioned compound can be utilized in the same manner. The amount of the acid is generally not more than 40 wt %, preferably not more than 20 wt %, based on the total weight of the composition.

Further, the first superfine pattern-forming composition of the present invention may contain other additives, if necessary. Examples of the additives include surfactants, organic solvents, germicides, antibacterial agents, antiseptic agents and anti-mold agents. It is essentially necessary for those additives not to affect the performance of the superfine pattern-forming composition. The amount of the additives is normally not more than 1%, preferably not more than 0.1%, more preferably not more than 0.001%, based on the total weight of the composition.

(2) Second Composition for Forming a Superfine Pattern

According to a second embodiment of the present invention, the superfine pattern-forming composition comprises pure water, an acid and a water-soluble resin represented by the following formula (1'):

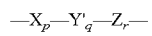 (1')

wherein
X, Y' and Z are repeating units of

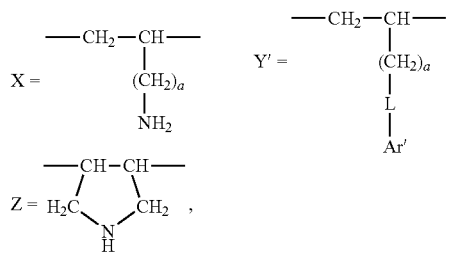

respectively;

p, q and r are numbers of polymerization ratios of the repeating units X, Y' and Z, respectively, provided that they satisfy the conditions of 0.60≤p+r≤0.95, preferably 0.80≤p+r≤0.95 and 0.05≤q≤0.40, preferably 0.05≤q≤0.20 and that each repeating unit may combine with each other either randomly or to form a block;

a in the repeating unit X or Y' is an integer of 0 or 1;

L' in the repeating unit Y' is a divalent linking group selected from the group consisting of
—N=CH—,
—NH—CHR$^{O'}$—,
—NH—CH$_2$—CHR$^{O'}$— and
—NH—CHR$^{O'}$—CH$_2$—
where R$^{O'}$ is selected from the group consisting of —H, —CH$_3$, —CH(CH$_3$)$_2$ and —COOC$_2$H$_5$;

Ar' in the repeating unit Y' is a group represented by the following formula:

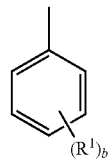

where b is an integer of 0 to 5, preferably 0 to 1; R$^1$ is an organic group comprising elements selected from the group consisting of carbon, nitrogen, oxygen and fluorine; and in the case where b is 2 or more, two R$^1$s may combine with each other to form a ring structure, respectively;

and
each of the repeating units X and Y' may be a combination of repeating units having different structures.

In the formula (1'), each of the repeating units X and Y' may be a combination of two or more repeating units having different integers (a), linking groups (L') and/or substituents (Ar'). It should be noted that the repeating unit Y' must be present but either X or Z may be absent in the formula (1). In other words, either p or r in the formula (1) may be equal to 0. However, if the number r is not equal to 0, the resultant resin tends to have improved etching resistance. The resin, therefore, preferably comprises the repeating unit Z.

The substituent Ar' is an aromatic group which may have a substituent R$^1$. The substituent R$^1$ is an organic group comprising elements selected from the group consisting of carbon, nitrogen, oxygen and fluorine. In the case where R$^1$ contains carbon, the number of carbon atoms is preferably 1 to 10. On the other hand, in the case where R$^1$ does not contain carbon, the group $R^1$ may be a fluorine atom or amino or otherwise may consist of oxygen and nitrogen atoms only. The group $R^1$ is preferably selected from the group consisting of alkyl, alkoxy, hydroxy alkyl, substituted amino, non-substituted amino, alkylether, alkylester, alkylamido, fluorine atom and fluorinated alkoxy, more preferably dimethylamino. Preferred examples of Ar' are as follows.

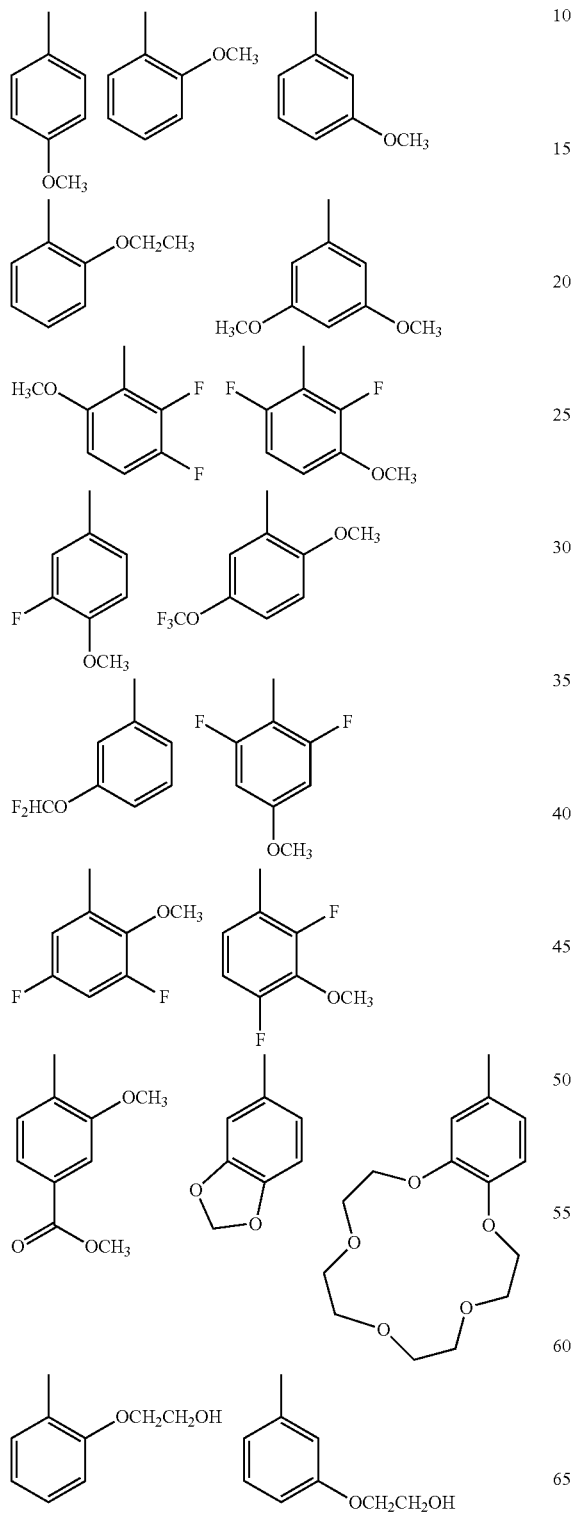

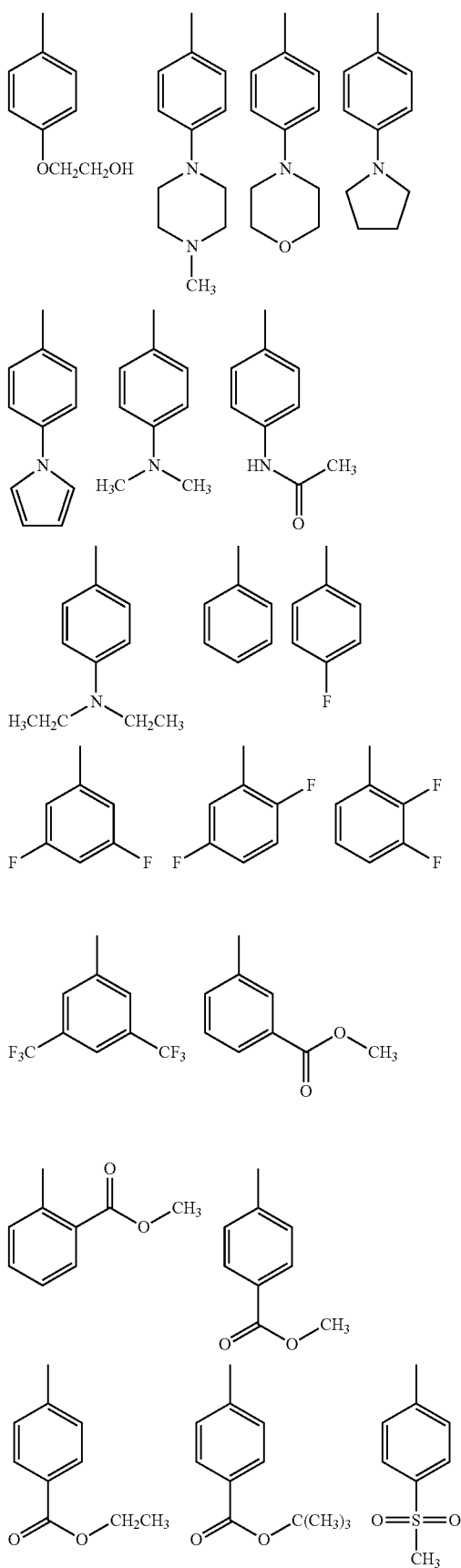

-continued

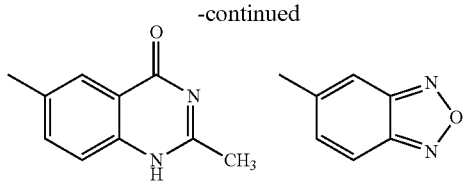

There is no particular restriction on the molecular weight of the water-soluble resin contained in the second superfine pattern-forming composition, but the weight average molecular weight thereof is generally 3000 to 100000, preferably 5,000 to 20,000.

The second composition according to the present invention comprises pure water and the water-soluble resin represented by the above formula (1'). The concentration of the resin can be freely determined according to the kind of the resist, the aimed pattern size and the like, but is generally 0.1 to 10 wt %, preferably 1.0 to 7.0 wt %, based on the total weight of the composition.

Further, the second superfine pattern-forming composition of the present invention indispensably comprises an acid. There is no particular restriction on the kind of the acid, as long as it does not give unfavorable effects to the resist pattern. However, the acid is preferably selected from the group consisting of nitric acid, sulfuric acid, acetic acid, benzenesulfonic acid, p-toluenesulfonic acid, 2-naphthalenesulfonic acid, 1,3-benzenedisulfonic acid, 1,5-naphthalenedisulfonic acid and 2,7-naphthalenedisulfonic acid. The amount of the acid is generally not more than 40 wt %, preferably not more than 30 wt %, based on the total weight of the composition.

The second composition of the present invention for forming a superfine pattern may contain other additives, if necessary. The kinds and amounts of usable additives are the same as those described above for the first composition.

The above description thus explains the superfine pattern-forming composition according to the second embodiment of the present invention. To put it simply, the second composition is different from the first one in that it further contains an acid but comprises the water-soluble resin having no acid group.

(3) Third Composition for Forming a Superfine Pattern

According to a third embodiment of the present invention, the superfine pattern-forming composition comprises pure water and a particular water-soluble resin. The water-soluble resin is a product of the reaction of a particular backbone polymer with a particular side-chain forming compound.

The backbone polymer is represented by the following formula (2):

$$-X^0_{p0}-Z^0_{r0}- \qquad (2)$$

in which
$X^0$ and $Z^0$ are repeating units of

respectively;
p0 and r0 are numbers of polymerization ratios of the repeating units $X^0$ and $Z^0$, respectively, provided that they satisfy the conditions of $0.05 \leq p0 \leq 1$ and $0 \leq r0 \leq 0.95$ and that each repeating unit may combine with each other either randomly or to form a block;

a0 in the repeating unit $X^0$ is an integer of 0 or 1; and
the repeating unit $X^0$ may be a combination of repeating units having different a0 integers.

The —$NH_2$ or —NH— group in the backbone polymer is made to react with the side-chain forming compound represented by the following formula (3A) or (3B), to form a water-soluble resin having aromatic group-containing substituents at the side chain.

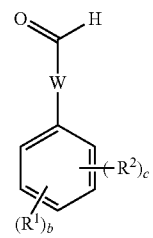

(3A)

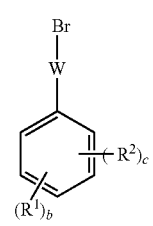

(3B)

In the formulas, b is an integer of 0 to 5, preferably 0 to 1; c is an integer of 0 to 5–b, preferably 1 to 2; W is a single bond or a divalent linking group selected from the group consisting of —$CHR^0$— and —$CHR^0$—$CH_2$— where $R^0$ is selected from the group consisting of —H, —$CH_3$, —$CH(CH_3)_2$, —COOH, —$CH_2$COOH, and —$COOC_2H_5$; $R^1$ is an organic group comprising elements selected from the group consisting of carbon, nitrogen, oxygen and fluorine; in the case where b is 2 or more, two $R^1$s may combine with each other to form a ring structure; $R^2$ is an acid group selected from the group consisting of —COOH, —$CH_2$COOH, —$CH(CH_3)$COOH, —$OCH_2$COOH, —$SO_3$H and —OH, preferably —COOH or —$SO_3$H; and W or $R^1$ includes at least one acid group.

The side-chain forming compound may be a combination of two or more.

Since W or $R^2$ includes an acid group, the water-soluble resin contains an acid group. The side-chain forming compound undergoes a substitution reaction with the —$NH_2$ or —NH— groups in the backbone polymer, so that the nitrogen atoms are combined with aromatic group-containing substituents. However, it is unnecessary for all the nitrogen atoms to be combined with the substituents. Consequently, the third superfine pattern-forming composition of the present invention contains a water-soluble resin in which aromatic group-containing substituents derived from the side-chain forming compound are combined with 5 to 40%, preferably 5 to 20%, of nitrogen atoms in the backbone polymer.

The following are preferred examples of the side-chain forming compound usable for forming the water-soluble resin contained in the third composition for forming a superfine pattern.

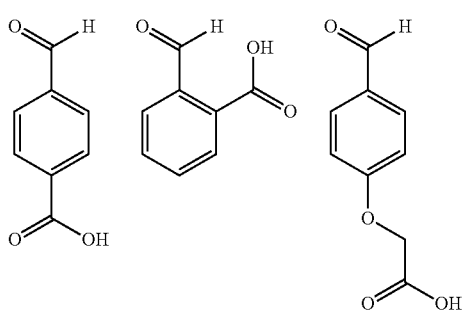
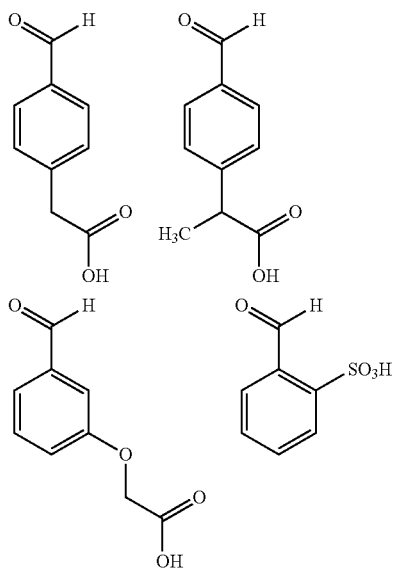
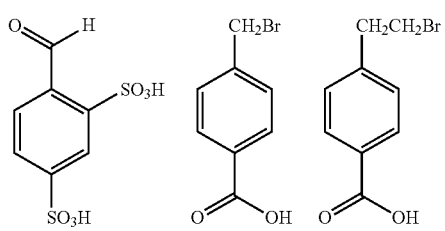
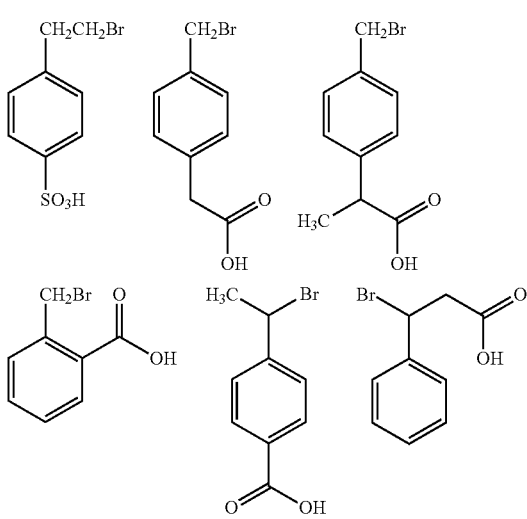

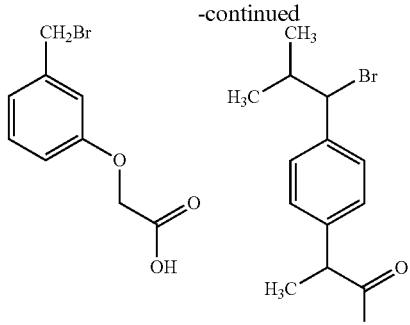
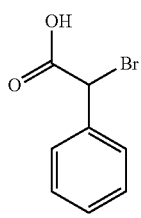

The water-soluble resin thus formed is also usable as the resin contained in the above-described first superfine pattern-forming composition. Accordingly, the molecular weight and amount of the water-soluble resin and the additives and amounts thereof are the same as those of the above-described first composition.

(4) Fourth Composition for Forming a Superfine Pattern

According to a fourth embodiment of the present invention, the superfine pattern-forming composition comprises pure water, an acid and a particular water-soluble resin. The water-soluble resin is a product of the reaction of a particular backbone polymer with a particular side-chain forming compound.

The backbone polymer is the same as that represented by the formula (2) described above for the third composition. However, the third and fourth compositions are different in the side-chain forming compound to be made to react with the backbone polymer. The side-chain forming compound used for the fourth composition is represented by the following formula (3A') or (3B'):

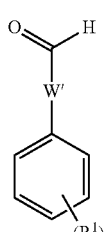

(3A')

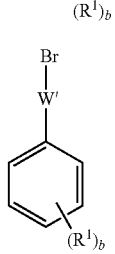

(3B')

in which b is an integer of 0 to 5, preferably 0 to 1; W' is a single bond or a divalent linking group selected from the group consisting of —CHR$^{O'}$— and —CHR$^{O'}$—CH$_2$— where R[O'] is selected from the group consisting of —H, —CH$_3$ and —COOC$_2$H$_5$; R[1] is an organic group comprising elements selected from the group consisting of carbon, nitrogen, oxygen and fluorine; and in the case where b is 2 or more, two R[1]s may combine with each other to form a ring structure.

The side-chain forming compounds of (3A') and (3B') are different from those of (3A) and (3B) in that they contain no acid group. The side-chain forming compound may be a combination of two or more.

The side-chain forming compound undergoes a substitution reaction with the —NH$_2$ or —NH— groups in the backbone polymer, so that the nitrogen atoms are combined with aromatic group-containing substituents. However, it is unnecessary for all the nitrogen atoms to be combined with the substituents. Consequently, the fourth superfine pattern-forming composition of the present invention contains a water-soluble resin in which aromatic group-containing substituents derived from the side-chain forming compound are combined with 5 to 40%, preferably 5 to 15%, of nitrogen atoms in the backbone polymer.

The following are preferred examples of the side-chain forming compound usable for forming the water-soluble resin contained in the fourth superfine pattern-forming composition.

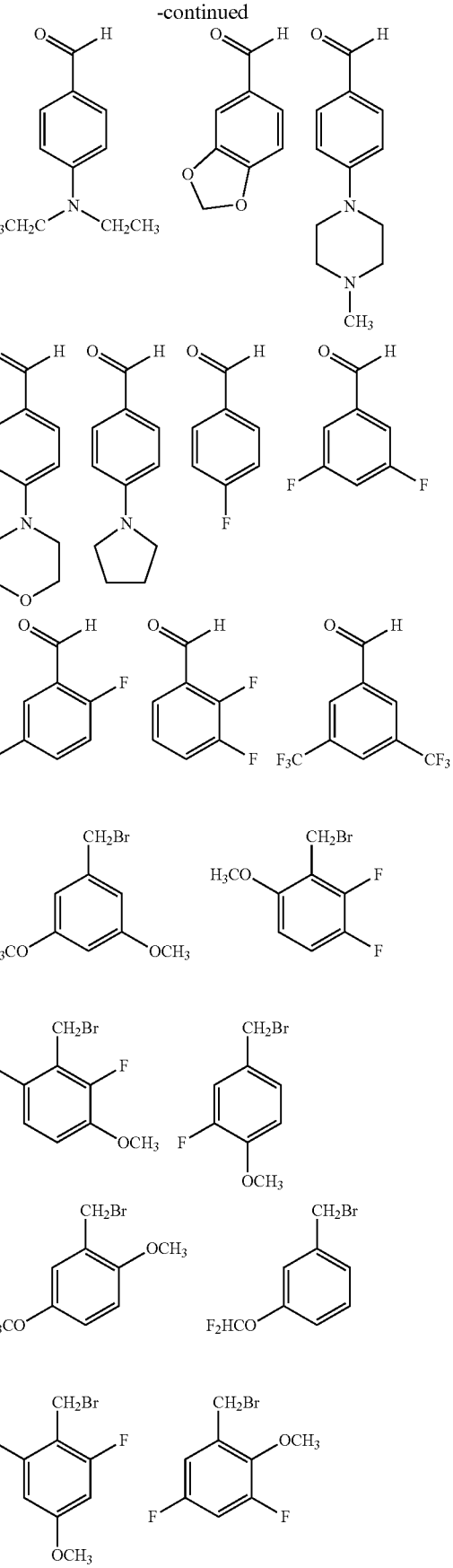

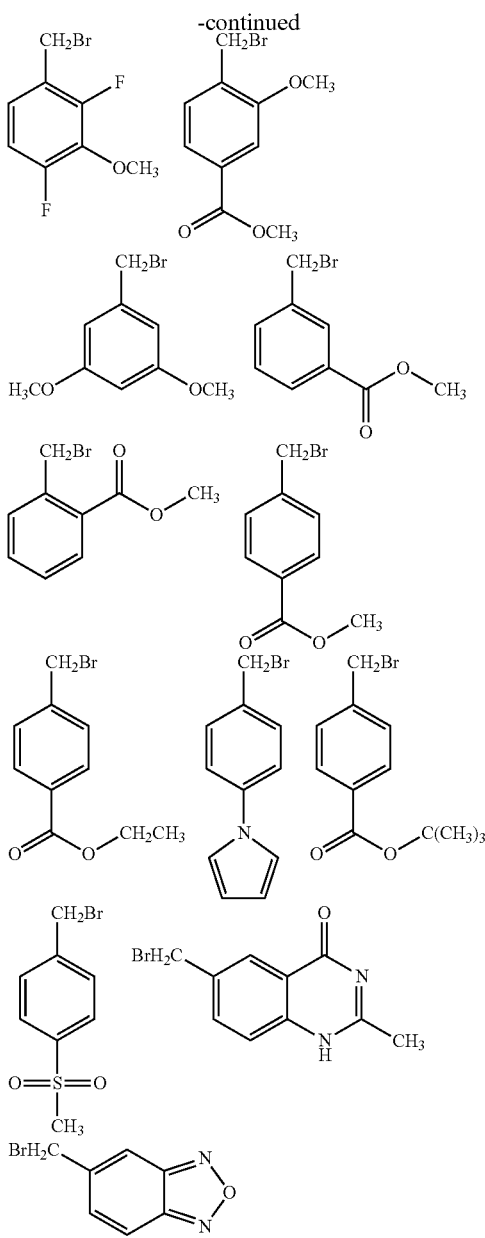

The water-soluble resin thus formed is also usable as the resin contained in the above-described second superfine pattern-forming composition. Accordingly, the molecular weight and amount of the water-soluble resin and the additives and amounts thereof are the same as those of the above-described second composition.

Pattern Formation Method

The following is an explanation of the method according to the present invention for forming a superfine resist pattern. The pattern formation method described below is a typical one employing the superfine pattern-forming composition of the present invention.

First, a resist composition is applied on a surface, which may be pretreated, if necessary, of a substrate, such as a silicon substrate or a glass substrate, according to a known coating method such as spin-coating method, to form a resist composition layer. Prior to the coating of the resist composition, an antireflection film may be beforehand formed on the substrate surface. The antireflection film can improve the section shape and the exposure margin.

Any known resist composition can be used in the pattern formation method of the present invention. Representative examples of the compositions usable in the present invention include: a composition comprising a quininediazide type photosensitive substance and an alkali-soluble resin, and a chemically amplified resist composition (which are positive-working compositions); a composition comprising a photosensitive functional group-containing polymer such as polyvinyl cinnamate, a composition comprising an aromatic azide compound, a composition comprising a cyclized rubber and an azide compound such as a bisazide compound, a composition comprising a diazo resin, a photo-polymerizable composition comprising an addition-polymerizable unsaturated compound, and a negative-working chemically amplified resist composition (which are negative-working compositions).

Examples of the quinonediazide type photosensitive substance used in the positive-working resist composition comprising a quinonediazide type photosensitive substance and an alkali-soluble resin include: 1,2-benzoquinonediazide-4-sulfonic acid, 1,2-naphtho-quinonediazide-4-sulfonic acid, 1,2-naphthoquinone-diazide-5-sulfonic acid, and sulfonic esters or amides thereof. Examples of the alkali-soluble resin include: novolak resin, polyvinyl phenol, polyvinyl alcohol, and copolymers of acrylic acid or methacrylic acid. The novolak resin is preferably prepared from one or more phenols such as phenol, o-cresol, m-cresol, p-cresol and xylenol in combination with one or more aldehydes such as formaldehyde and paraformaldehyde.

Either positive- or negative-working chemically amplified resist composition can be used in the pattern formation method of the present invention. The chemically amplified resist generates an acid when exposed to ultraviolet radiation, and the acid serves as a catalyst to promote chemical reaction by which solubility to the developing solution is changed within the areas irradiated with the ultraviolet radiation to form a pattern. For example, the chemically amplified resist composition comprises an acid-generating compound, which generates an acid when exposed to ultraviolet radiation, and an acid-sensitive functional group-containing resin, which decomposes in the presence of acid to form an alkali-soluble group such as phenolic hydroxyl or carboxyl group. The composition may comprise an alkali-soluble resin, a crosslinking agent and an acid-generating compound.

The resist composition layer formed on the substrate is prebaked, for example, on a hot plate to remove solvent contained in the composition, to form a photoresist film normally having a thickness of approx. 0.1 to 2.5 μm. The prebaking temperature depends on the solvent and the resist compound, but is normally approx. 20 to 200° C., preferably approx. 50 to 150° C.

The photoresist film is then subjected to exposure through a mask, if necessary, by means of known exposure apparatus such as a high-pressure mercury lamp, a metal halide lamp, an ultra-high pressure mercury lamp, a KrF excimer laser, an ArF excimer laser, a soft X-ray irradiation system, and an electron beam lithography system.

After the exposure, baking treatment may be carried out, if necessary, and then development such as paddle development is carried out to form a resist pattern. The resist is normally developed with an alkali developer. Examples of the alkali developer include an aqueous solution of sodium hydroxide, tetramethylammonium hydroxide (TMAH) or tetrabutylammonium hydroxide (TBAH). After the development, the resist pattern is rinsed (washed) with a rinse solution. The thus-formed resist pattern is employed as a resist for etching, plating, ion diffusion or dyeing, and then, if necessary, peeled away.

The pattern formation method according to the present invention enables to miniaturize a resist pattern effectively even if the pattern is fine and has a high aspect ratio. Here, the term "aspect ratio" means the ratio of height to width of the pattern. Accordingly, the method of the present invention is preferably combined with a lithographic process capable of giving a fine resist pattern, such as, a lithographic process comprising exposure at a wavelength of 250 nm or shorter with a light source of a KrF excimer laser, an ArF excimer laser, an X-ray irradiation system or an electron beam lithography system. Further, the lithographic process preferably produces a resist pattern having such a pattern dimension that a line width of the line-and-space pattern or a hole diameter of the contact hole pattern is not more than 300 nm, preferably not more than 50 nm.

Subsequently, the obtained resist pattern is coated with the superfine pattern-forming composition of the present invention, to form a covering layer. Before coated with the composition, the developed resist pattern is preferably washed with pure water or the like.

The covering layer formed on the resist pattern is then heated, so that the component of the covering layer penetrates through the resist pattern, and the composition in the part adjacent to the photoresist resin undergoes a reaction. As a result, the resist pattern is covered with the hardened covering layer, namely, with an insoluble layer. Thereafter, the unhardened composition is rinsed away with water or a solvent, to obtain a superfine pattern having a reduced effective size.

In the above procedure, the insoluble layer covers inner walls of ridges in the resist pattern and consequently the width among the ridges is narrowed to reduce the pitch size or hole opening size. Thus, the present invention enables to miniaturize a resist pattern effectively beyond the limiting resolution.

The superfine pattern-forming composition can be applied on the resist pattern in any coating method, such as spin coating method, slit coating method, spray coating method, dip coating method or roller coating method. Those methods have been conventionally adopted for coating photoresist resin compositions. If necessary, the covering layer can be further heated by prebaking.

The covering layer is heated at, for example, 40 to 200° C., preferably 80 to 160° C., for 10 to 300 seconds, preferably 30 to 120 seconds. The thickness of the insoluble layer thus formed can be adequately controlled by selecting the conditions such as the temperature and time of heating, the kind of the photoresist resin composition and the like. Accordingly, those conditions are determined according to how far the resist pattern must be miniaturized, namely, how much the width of the resist pattern must be broadened. However, the insoluble layer is normally made to have a thickness of 0.01 to 100 μm from the surface of the resist pattern.

The washing procedure, in which the composition in the covering layer is rinsed away to leave the insoluble layer formed by heating, is carried out by use of a solvent in which the composition is well-soluble but the insoluble layer is not. The solvent is preferably the same as that used in the superfine pattern-forming composition, and hence it is particularly preferred to use pure water.

As described above, the resist pattern immediately after developed is covered with the insoluble layer, so as to be effectively miniaturized. The resist pattern thus obtained according to the present invention has such high etching resistance as to be advantageous in producing semiconductor devices or the like having finer patterns.

The present invention is further explained by use of the following Examples.

RESIST PATTERN FORMATION EXAMPLE 1

A silicon substrate was spin-coated with a resist composition (positive-working photoresist, AX2050P [trademark], manufactured by AZ Electronic Materials (Japan) K.K.) and then heated at 120° C. for 90 seconds, to form a photoresist film of 0.16 μm thickness. The formed resist film was then subjected to exposure by means of an ArF exposure apparatus (NSR-S306C stepper [trademark], manufactured by Nikon Corporation) to image a 1:1 hole pattern of 140 nm width. Subsequently, the resist film was successively subjected to post-exposure baking (PEB) at 110° C. for 90 seconds, to paddle development for 60 seconds with a 2.38% aqueous solution of tetramethylammonium hydroxide and to rinse treatment for 15 seconds with pure water. Thus, Resist pattern 1 was obtained.

RESIST PATTERN FORMATION EXAMPLE 2

A silicon substrate was spin-coated with a resist composition (positive-working photoresist, AX1120P [trademark], manufactured by AZ Electronic Materials (Japan) K.K.) and then heated at 100° C. for 90 seconds, to form a photoresist film of 0.20 μm thickness. The formed resist film was then subjected to exposure by means of an ArF exposure apparatus (NSR-S306C stepper [trademark], manufactured by Nikon Corporation) to image a 1:1 trench pattern of 120 nm width. Subsequently, the resist film was successively subjected to post-exposure baking (PEB) at 120° C. for 90 seconds, to paddle development for 60 seconds with a 2.38% aqueous solution of tetramethylammonium hydroxide and to rinse treatment for 15 seconds with pure water. Thus, Resist pattern 2 was obtained.

Polyallylamine Polymer

Polyallylamine polymers having weight average molecular weights of 12000, 26000 and 7800 were prepared as the standards. Those are commercially available from Nitto Boseki Co., Ltd. Hereinafter, they are referred to as PA100, PA200 and PA300, respectively.

Allylamin-Diallylamine Copolymer

In a 3 L separable four-neck round bottom flask equipped with a stirrer, a thermometer, and a Dimroth condenser, methanol solution having 50 wt % of monomer concentration containing diallylamine hydrochloride (3.0 mol) and monoallylamine hydrochloride (3.0 mol) was placed and maintained at 55° C. in a thermostat. Then, 17.23 g of dimethyl2,2'-azobis (2-methylpropionate) (2.5 mol % per monomer) was added. In $24^{th}$ hour, $48^{th}$ hour, $72^{nd}$ hour after starting polymerization reaction, same amount of dimethyl2,2'-azobis(2-methylpropionate) was added, respectively, and polymerization reaction carried out for 120 hour in total.

After polymerization reaction, obtained mixture was added to 2 L of iso-propanol. A deposited crystal was separated by filtration, and washed with iso-propanol. The crystal was dried in vacuum at 50° C. for 24 hours. Then, anhydrous copolymer of diallylamine hydrochloride and monoallylamine hydrochloride was obtained. The copolymer was subjected to anion exchange using ion-exchange resin Amberlite IRA400J (Trademark, available from Organo Corporation), then copolymer in which copolymerization ratio of units derived from monoallylamine and units derived from diallylamine (containing pyrrolidine ring) is 50:50 (weight average molecular weight 7,000) was obtained. Hereinafter, this copolymer is referred to as PAP400.

The above procedure was repeated except for only changing the compounding ratio of monomer to obtain the polymer having copolymerization ratio of units derived from monoallylamine and units derived from diallylamine (containing pyrrolidine ring) is 20:80 (weight average molecular weight 7,000). Hereinafter, this copolymer is referred to as PAP500.

Polyvinylamine Polymer

In a 3 L jacketed separable flask equipped with a stirrer, a thermometer, a condenser, a dropping funnel and a nitrogen introduction tube, 1.592 g of desalted water was placed and heated to 70° C. Subsequently, under nitrogen atmosphere, 50 g of 10 wt % aqueous solution of azo-type polymerization initiator (V-50 [trademark], manufactured by Wako Pure Chemical Industries, Ltd.) was added and immediately 833 g (7.03 mol) of 60 wt % aqueous solution of N-vinylformamide was started to be dropwise added into the flask. One hour after the start of the dropwise addition, 25 g of 10 wt % V-50 aqueous solution was further added. The dropwise addition was continued for two hours in total. After the dropwise addition was completed, the solution was ripened at 70° C. for 3 hours. Thereafter, the solution was cooled to cease the reaction, to obtain a 20 wt % aqueous solution of N-vinylformamide polymer (hereinafter, referred to as "Polymer solution A").

Polymer solution A in an amount of 100 g (corresponding to a polymer content of 20 g) and 1.95 g of hydrochloric hydroxylamine were placed in a 200 mL jacketed separable flask equipped with a stirrer, a condenser, a thermometer, and a nitrogen introduction tube. The mixture was then made to react at 50° C. for 1 hour under nitrogen atmosphere. After 35 wt % aqueous solution of sodium hydroxide was added in an amount of 46.8 g (corresponding to 1.4 equivalents based on the formamide groups in the polymer), the solution was heated at 80° C. for 5 hours to undergo a hydrolysis reaction. A portion of the obtained solution was collected and poured into an excess amount of 10 wt % HCl (35%)/methanol, so as to deposit the polymer in the form of hydrochloric salt. The polymer was then subjected to anion exchange by use of anion exchange resin (Amberlite IRA400J [trademark], manufactured by Organo Corporation), to obtain the aimed polyvinylamine having Mw=76391 (hereinafter, referred to as "PV600").

Synthesis of 4-carboxybenzimino Group-substituted Polyallylamine

In a three-necked round flask, 50.0 g of 15 wt % PA100 aqueous solution was placed and stirred. After the temperature of the solution was adjusted at 24° C., 0.98710 g of 4-carboxybenzaldehyde (manufactured by Tokyo Chemical Industry Co., Ltd.) was added and then stirred for 12 hours, to obtain the aimed polymer PA101. The obtained polymer was analyzed by means of NMR. As a result, it was verified that 5 mol % of all amino groups in PA100 before substitution were replaced with 4-carboxybenzimino groups. Namely, regarding polymer PA101, copolymerization ratio q of the repeating unit Y in formula (1) or of the repeating unit Y' in formula (1') (hereinafter, the ratio is referred to as copolymerization ratio q) was 5 mol %

The above procedure was repeated except for only changing the amount of 4-carboxybenzaldehyde, to obtain the polymer PA102 having copolymerization ratio q of 10 mol %.

Further, the above procedure was again repeated except that PA100 was replaced with PA200, to obtain the polymers PA201 and PA202 having copolymerization ratios q of 5 mol % and 10 mol %, respectively.

Furthermore, the above procedure was still again repeated except that PA100 was replaced with PA300, to obtain the polymers PA301 and PA302 having copolymerization ratios q of 5 mol % and 10 mol %, respectively.

Synthesis of 2-carboxybenzimino Group-substituted Polyallylamine

In a three-necked round flask, 50.0 g of 15 wt % PA100 aqueous solution was placed and stirred. After the temperature of the solution was adjusted at 24° C., 0.98770 g of 2-carboxybenzaldehyde (manufactured by Tokyo Chemical Industry Co., Ltd.) was added and then stirred for 12 hours, to obtain the aimed polymer PA111. The obtained polymer was analyzed by means of NMR. As a result, it was verified that 5 mol % of all amino groups in PA100 before substitution were replaced with 2-carboxybenzimino groups.

The above procedure was repeated except for only changing the amount of 2-carboxybenzaldehyde, to obtain the polymers PA112 and PA113 having copolymerization ratios q of 10 mol % and 15 mol %, respectively.

Further, the above procedure was again repeated except that PA100 was replaced with PA200, to obtain the polymers PA211 and PA212 having copolymerization ratios q of 5 mol % and 10 mol %, respectively.

Synthesis of 2-sulfobenzimino Group-substituted Polyallylamine

First, 2-sulfobenzaldehyde sodium salt (manufactured by Tokyo Chemical Industry Co., Ltd.) was subjected to ion exchange by use of ion exchange resin (15JWET [trademark], manufactured by Organo Corporation), so that sodium ions were removed to obtain 2-sulfobenzaldehyde. Independently, 50.0 g of 15 wt % PA100 aqueous solution was placed in a three-necked round flask, and then stirred. After the temperature of the solution was adjusted at 24° C., 1.2241 g of the obtained 2-sulfobenzaldehyde was added and then stirred for 12 hours, to obtain the aimed polymer PA121. The obtained polymer was analyzed by means of NMR. As a result, it was verified that 5 mol % of all amino groups in PA100 before substitution were replaced with 2-sulfobenzimino groups.

The above procedure was repeated except for only changing the amount of 2-sulfobenzaldehyde, to obtain the polymers PA122 and PA123 having copolymerization ratios q of 10 mol % and 20 mol %, respectively.

Further, the above procedure was again repeated except that PA100 was replaced with PA200, to obtain the polymers PA221, PA222 and PA223 having copolymerization ratios q of 5 mol %, 10 mol % and 15 mol %, respectively.

Synthesis of N-(4-carboxybenzyl)amino Group-substituted Polyallylamine

In a three-necked round flask, 50.0 g of 15 wt % PA100 aqueous solution was placed. 1.41226 g of 4-bromomethylbenzoic acid (manufactured by Tokyo Chemical Industry Co., Ltd.) was added and then stirred for 4 hours. After the reaction, the reaction mixture was subjected to anion exchange by use of anion exchange resin (Amberlite IRA400J [trademark], manufactured by Organo Corporation) and hydrogen bromide as a by-product was removed, to obtain the aimed polymer PA131. The obtained polymer was analyzed by means of NMR. As a result, it was verified that 5 mol % of all amino groups in PA100 before substitution were replaced with N-(4-carboxybenzil) amine groups. The above procedure was repeated except for only changing the amount of 4-bromomethylbenzoic acid, to obtain the polymers PA132 having copolymerization ratios q of 10 mol %.

Synthesis of 4-hydroxybenzimino Group-substituted Polyallylamine

In a three-necked round flask, 50.0 g of 15 wt % PA100 aqueous solution was placed and stirred. After the temperature of the solution was adjusted at 24° C., 0.7980 g of 4-hydroxybenzaldehyde (manufactured by Tokyo Chemical Industry Co., Ltd.) was added and then stirred for 12 hours, to obtain the obtained polymer PA141. The obtained polymer was analyzed by means of NMR. As a result, it was verified that 5 mol % of all amino groups in PA100 before substitution were replaced with 4-hydroxybenzimino groups.

Synthesis of 4-dimethylaminobenzimino Group-substituted Polyallylamine

In a three-necked round flask, 50.0 g of 15 wt % PA100 aqueous solution was placed and stirred. After the temperature of the solution was adjusted at 24° C., 0.9798 g of 4-dimethylaminobenzaldehyde (manufactured by Tokyo Chemical Industry Co., Ltd.) was added and then stirred for 12 hours, to obtain the aimed polymer PA151. The obtained polymer was analyzed by means of NMR. As a result, it was verified that 5 mol % of all amino groups in PA100 before substitution were replaced with 4-dimethylaminobenzimino groups.

The above procedure was repeated except for only changing the amount of 4-dimethylaminobenzaldehyde, to obtain the polymer PA152 having a copolymerization ratio q of 10 mol %.

Synthesis of 4-methoxybenzimino Group-substituted Polyallylamine

In a three-necked round flask, 50.0 g of 15 wt % PA100 aqueous solution was placed and stirred. After the temperature of the solution was adjusted at 24° C., 0.8952 g of 4-methoxybenzaldehyde (manufactured by Tokyo Chemical Industry Co., Ltd.) was added and then stirred for 12 hours, to obtain the aimed polymer PA161. The obtained polymer was analyzed by means of NMR. As a result, it was verified that 5 mol % of all amino groups in PA100 before substitution were replaced with 4-methoxybenzimino groups.

The above procedure was repeated except for only changing the amount of 4-methoxybenzaldehyde, to obtain the polymer PA162 having a copolymerization ratio q of 10 mol %.

Synthesis of 4-acetamidebenzimino Group-substituted Polyallylamine

In a three-necked round flask, 50.0 g of 15 wt % PA100 aqueous solution was placed and stirred. After the temperature of the solution was adjusted at 24° C., 1.0728 g of 4-acetamidebenzaldehyde (manufactured by Tokyo Chemical Industry Co., Ltd.) was added and then stirred for 12 hours, to obtain the aimed polymer PA170. The obtained polymer was analyzed by means of NMR. As a result, it was verified that 5 mol % of all amino groups in PA100 before substitution were replaced with 4-acetamidebenzimino groups.

Synthesis of Substituted Allylamine-Diallylamine Copolymer

In a three-necked round flask, 50.0 g of 15 wt % PAP400 aqueous solution was placed and stirred. After the temperature of the solution was adjusted at 24° C., 0.8818 g of 4-carboxybenzaldehyde (manufactured by Tokyo Chemical Industry Co., Ltd.) was added and then stirred for 12 hours, to obtain the aimed polymer PAP411. The obtained polymer was analyzed by means of NMR. As a result, it was verified that 10 mol % of all amino groups in PAP400 before substitution were replaced with 4-carboxybenzimino groups.

The above-mentioned method for producing PAP411 was repeated except for only changing the amount of 4-carboxybenzaldehyde, to obtain the polymer PAP412 having a copolymerization ratio q of 15 mol %.

The above-mentioned method for producing PAP411 was repeated except for replacing PAP400 with PAP500, to obtain the polymers PAP511 and PAP512 having a copolymerization ratios q of 5 mol % and 10 mol % respectively.

The above-mentioned method for producing PAP411 was repeated except for only replacing 4-carboxybenzaldehyde with 4-diethylaminobenzadehyde, to obtain the polymer PAP420 having a copolymerization ratio q of 5 mol %.

The above-mentioned method for producing PAP411 was repeated except for only replacing 4-carboxybenzaldehyde with 4-dimethylaminobenzadehyde, to obtain the polymers PAP430 and PAP440 having a copolymerization ratios q of 5 mol % and 10 mol %, respectively.

The above-mentioned method for producing PAP411 was repeated except for only replacing 4-carboxybenzaldehyde with 4-acetamidebenzadehyde, to obtain the polymer PAP450 having a copolymerization ratio q of 5 mol %.

Synthesis of Substituted Polyvinylamines

In the same manner as the above substituted polyallylamines, PV600 was made to react with 4-carboxybenzaldehyde, 2-carboxybenzaldehyde or 4-sulfobenzaldehyde to synthesize the following substituted polyvinylamines, namely, PV601: 4-carboxybenzimino group-substituted polyvinylamine (copolymerization ratio q: 5%);
PV602: 4-carboxybenzimino group-substituted polyvinylamine (copolymerization ratio q: 10%);
PV611: 2-carboxybenzimino group-substituted polyvinylamine (copolymerization ratio q: 5%);
PV612: 2-carboxybenzimino group-substituted polyvinylamine (copolymerization ratio q: 10%);
PV621: 4-sulfobenzimino group-substituted polyvinylamine (copolymerization ratio q: 5%);
PV622: 4-sulfobenzimino group-substituted polyvinylamine (copolymerization ratio q: 10%); and
PV623: 4-sulfobenzimino group-substituted polyvinylamine (copolymerization ratio q: 20%).

The prepared polymers are summarized in Table 1.

TABLE 1

| Polymer | Weight average molecular weight (before susbstitution reaction) | Repeating Unit 1 | | Repeating Unit 2 | | | Repeating Unit 3 | |
|---|---|---|---|---|---|---|---|---|
| | | X | P | Y | Y' | q | Z | r |
| PA100 | 12000 | PA | 1.00 | | | | | |
| PA101 | | | 0.95 | p-CA | | 0.05 | | |
| PA102 | | | 0.90 | | | 0.10 | | |
| PA111 | | | 0.95 | o-CA | | 0.05 | | |
| PA112 | | | 0.90 | | | 0.10 | | |
| PA113 | | | 0.85 | | | 0.15 | | |
| PA121 | | | 0.95 | o-SA | | 0.05 | | |
| PA122 | | | 0.90 | | | 0.10 | | |
| PA123 | | | 0.80 | | | 0.20 | | |
| PA131 | | | 0.95 | p-CA2 | | 0.05 | | |
| PA132 | | | 0.90 | | | 0.10 | | |
| PA141 | | | 0.95 | p-HI | | 0.05 | | |
| PA151 | | | 0.95 | | p-DEA | 0.05 | | |
| PA152 | | | 0.90 | | | 0.10 | | |
| PA161 | | | 0.95 | | p-MO | 0.05 | | |
| PA162 | | | 0.90 | | | 0.10 | | |
| PA170 | | | 0.95 | | p-AA | 0.05 | | |
| PA200 | 26000 | | 1.00 | | | | | |
| PA201 | | | 0.95 | p-CA | | 0.05 | | |
| PA202 | | | 0.90 | | | 0.10 | | |
| PA211 | | | 0.95 | o-CA | | 0.05 | | |
| PA212 | | | 0.90 | | | 0.10 | | |
| PA221 | | | 0.95 | o-SA | | 0.05 | | |
| PA222 | | | 0.90 | | | 0.10 | | |

TABLE 1-continued

| Polymer | Weight average molecular weight (before susbstitution reaction) | Repeating Unit 1 | | Repeating Unit 2 | | Repeating Unit 3 | |
|---|---|---|---|---|---|---|---|
| | | X | P | Y | Y' | q | Z | r |
| PA223  |       |    | 0.85 |       |       | 0.15 |     |      |
| PA300  | 7800  |    | 1.00 |       |       |      |     |      |
| PA301  |       |    | 0.95 | p-CA  |       | 0.05 |     |      |
| PA302  |       |    | 0.90 |       |       | 0.10 |     |      |
| PAP400 | 7000  |    | 0.50 |       |       |      | PDD | 0.50 |
| PAP411 |       |    | 0.40 | p-CA  |       | 0.10 |     |      |
| PAP412 |       |    | 0.35 |       |       | 0.15 |     |      |
| PAP420 |       |    | 0.45 |       | p-DEA | 0.05 |     |      |
| PAP430 |       |    | 0.45 |       | p-DMA | 0.05 |     |      |
| PAP440 |       |    | 0.40 |       |       | 0.10 |     |      |
| PAP450 |       |    | 0.45 |       | p-AA  | 0.05 |     |      |
| PAP500 |       |    | 0.20 |       |       |      |     | 0.80 |
| PAP511 |       |    | 0.10 | p-CA  |       | 0.10 |     |      |
| PAP512 |       |    | 0.05 |       |       | 0.15 |     |      |
| PV600  | 73291 | PV | 1.00 |       |       |      |     |      |
| PV601  |       |    | 0.95 | p-CA  |       | 0.05 |     |      |
| PV602  |       |    | 0.90 |       |       | 0.10 |     |      |
| PV611  |       |    | 0.95 | o-CA  |       | 0.05 |     |      |
| PV612  |       |    | 0.90 |       |       | 0.10 |     |      |
| PV621  |       |    | 0.95 | o-SA  |       | 0.05 |     |      |
| PV622  |       |    | 0.90 |       |       | 0.10 |     |      |
| PV623  |       |    | 0.80 |       |       | 0.20 |     |      |

In the table, symbols of repeating units are as follows:

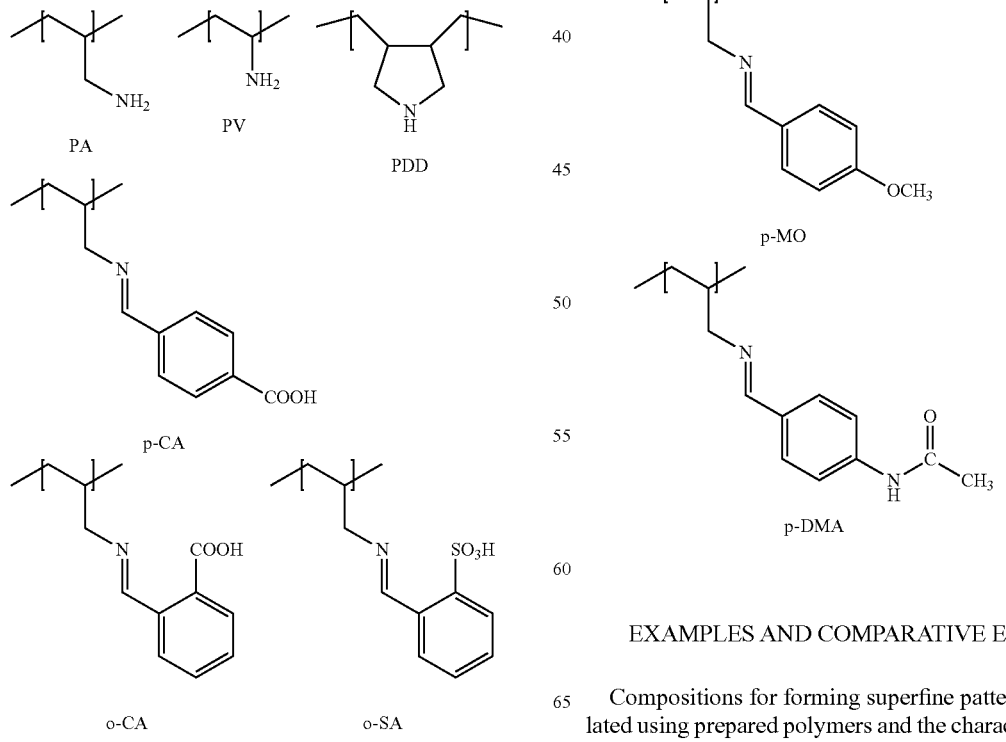

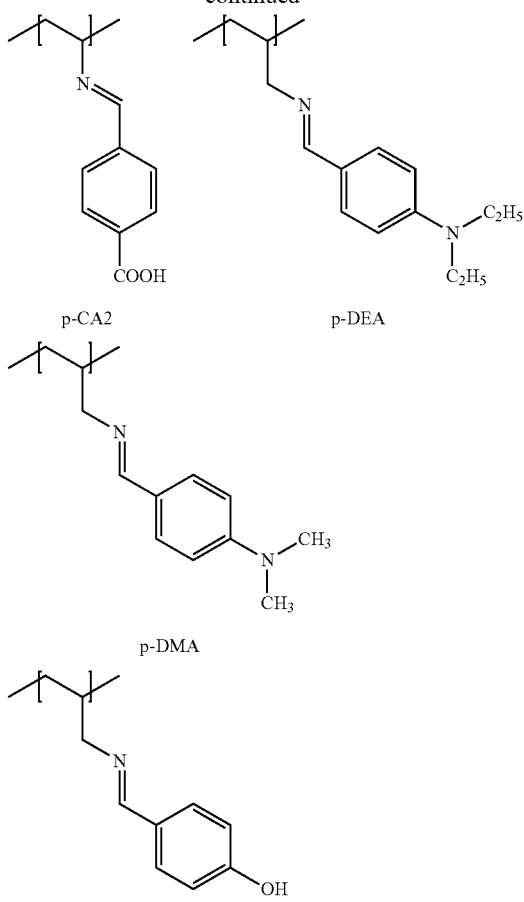

EXAMPLES AND COMPARATIVE EXAMPLES

Compositions for forming superfine patterns were formulated using prepared polymers and the characteristics thereof were evaluated as follows:

Evaluation on Dimension Reduction

Each of the above polymers was so dissolved in pure water that the concentration might be 6.5 wt %, to prepare compositions for forming superfine patterns. According to necessity, acids as additives were added to some of the obtained compositions. Subsequently, each composition was spin-coated on Resist patterns 1 and 2, independently, and then heated at 140° C. for 90 seconds. Thereafter, each pattern was subjected to paddle development with pure water for 60 seconds, and rinsed with pure water for 15 seconds.

Each resist pattern thus subjected to the miniaturizing treatment was observed under a scanning electron microscope (S-9200 [trademark], manufactured by Hitachi, Ltd.), to measure the size. Independently, the pattern before the treatment was observed in the same manner, to measure the size. The sizes before and after the miniaturizing treatment were compared to evaluate the dimension reduction. The results were as set forth in Tables 2 to 4.

Evaluation on Etching Resistance

Each superfine pattern-forming composition prepared above was spin-coated on a flat substrate, and then heated at 140° C. for 90 seconds. Thereafter, each substrate was subjected to paddle development with pure water for 60 seconds, and rinsed with pure water for 15 seconds, to form a covering film.

The substrate coated with the covering film was etched by means of a dry etching apparatus (NE-5000N [trademark], manufactured by ULVAC, Inc.) under the conditions of etching gases: Ar (10 cc/minute) and $CH_3F$ (50 cc/minute) and etching time: 20 seconds. The thickness of the film was measured before and after the etching procedure, and the etching resistance was evaluated according to the following formula:

etching resistance (Å/minute)=(thickness before etching−thickness after etching)/20.

The results were as set forth in Tables 2 to 4.

TABLE 2

| | Polymer | Concentration of sulfuric acid (wt %) | Dimension reduction Resist pattern 1 | Resist pattern 2 | Etching resistance |
|---|---|---|---|---|---|
| Com. 100 | PA100 | 0 | 25.7 | 4.1 | 41.3 |
| Ex. 101 | PA101 | 0 | 25.0 | 10.9 | 36.5 |
| Ex. 102 | PA102 | 0 | 24.8 | 17.6 | 37.4 |
| Ex. 111 | PA111 | 0 | 25.2 | 10.2 | 36.2 |
| Ex. 112 | PA112 | 0 | 26.8 | 16.0 | 35.2 |
| Ex. 113 | PA113 | 0 | 25.5 | 15.0 | 33.9 |
| Ex. 121 | PA121 | 0 | 25.1 | 10.5 | 35.6 |
| Ex. 122 | PA122 | 0 | 24.0 | 17.6 | 35.7 |
| Ex. 123 | PA123 | 0 | 43.1 | 18.5 | 35.6 |
| Ex. 131 | PA131 | 0 | 24.8 | 11.2 | 36.3 |
| Ex. 132 | PA132 | 0 | 24.8 | 18.2 | 37.1 |
| Com. 200 | PA200 | 0 | 26.1 | 6.3 | 39.5 |
| Ex. 201 | PA201 | 0 | 27.2 | 12.9 | 37.4 |
| Ex. 202 | PA202 | 0 | 27.3 | 19.6 | 33.4 |
| Ex. 211 | PA211 | 0 | 27.1 | 12.2 | 36.9 |
| Ex. 212 | PA212 | 0 | 28.8 | 18.0 | 32.9 |
| Ex. 221 | PA221 | 0 | 27.1 | 10.5 | 35.6 |
| Ex. 222 | PA222 | 0 | 26.0 | 17.6 | 35.7 |
| Ex. 223 | PA223 | 0 | 35.5 | 20.5 | 33.6 |
| Com. 300 | PA300 | 0 | 21.6 | 2.5 | 45.6 |
| Ex. 301 | PA301 | 0 | 24.0 | 9.9 | 41.4 |
| Ex. 302 | PA302 | 0 | 23.8 | 16.6 | 37.0 |

TABLE 3

| | Polymer | Acid kind | Concentration (wt %) | Dimension reduction Resist pattern 2 | Etching resistance |
|---|---|---|---|---|---|
| Com. 100 | PA100 | SA | 0 | 4.1 | 41.3 |
| Com. 100A | PA100 | SA | 10 | 14.0 | 45.4 |
| Com. 100B | PA100 | SA | 20 | 13.6 | 49.6 |
| Com. 141 | PA141 | — | 0 | N/A | 31.1 |
| Ex. 141A | PA141 | SA | 10 | 4.3 | 34.6 |
| Ex. 141B | PA141 | SA | 20 | 6.2 | 38.1 |
| Com. 151 | PA151 | — | 0 | 8.2 | 36.4 |
| Com. 152 | PA152 | — | 0 | 8.3 | 35.5 |
| Ex. 152A | PA152 | SA | 10 | 16.5 | 38.9 |
| Com. 161 | PA161 | — | 0 | 5.1 | 36.5 |
| Com. 162 | PA162 | — | 0 | 10.6 | 35.1 |
| Ex. 162A | PA162 | SA | 10 | 9.3 | 38.9 |
| Ex. 170a | PA170 | TSA | 20 | 10.5 | 30.4 |
| Ex. 170b | PA170 | BDSA | 20 | 20.1 | 33.4 |
| Ex. 170c | PA170 | NSA | 20 | 12.7 | 15.6 |
| Ex. 170d | PA170 | 15NDSA | 20 | 18.9 | 20.5 |
| Ex. 101A | PA101 | AA | 5 | 13.8 | 35.1 |
| Ex. 101B | PA101 | AA | 10 | 15.2 | 37.5 |
| Ex. 102A | PA102 | AA | 5 | 16.0 | 35.2 |
| Ex. 102B | PA102 | AA | 10 | 16.7 | 38.5 |
| Ex. 101C | PA101 | TSA | 5 | 14.4 | 35.2 |
| Ex. 101D | PA101 | TSA | 10 | 16.5 | 34.8 |
| Ex. 102C | PA102 | TSA | 5 | 16.0 | 35.2 |
| Ex. 102D | PA102 | TSA | 10 | 18.6 | 34.7 |
| Ex. 101E | PA101 | 27NDSA | 5 | 16.5 | 34.2 |
| Com. 400 | PAP400 | — | 0 | 2.1 | 34.5 |
| Com. 400A | PAP400 | SA | 10 | 8.1 | 36.2 |
| Com. 400B | PAP400 | SA | 20 | 15.6 | 42.5 |
| Ex. 411 | PAP411 | — | 0 | 14.7 | 32.5 |
| Ex. 412 | PAP412 | — | 0 | 17.5 | 31.2 |
| Com. 420 | PAP420 | — | 0 | N/A | N/A |
| Ex. 420A | PAP420 | SA | 10 | 11.5 | 31.0 |
| Ex. 430A | PAP430 | SA | 10 | 15.4 | 33.2 |
| Ex. 440A | PAP440 | SA | 10 | 14.6 | 30.5 |
| Ex. 450a | PAP450 | TSA | 20 | 12.5 | 26.1 |
| Ex. 450b | PAP450 | BDSA | 20 | 22.1 | 31.0 |
| Ex. 450c | PAP450 | NSA | 20 | 14.1 | 15.6 |
| Ex. 450d | PAP450 | 15NDSA | 20 | 19.9 | 19.1 |
| Com. 500 | PAP500 | — | 0 | 6.3 | 33.1 |
| Ex. 511 | PAP511 | — | 0 | 16.7 | 31.2 |
| Ex. 512 | PAP512 | — | 0 | 18.9 | 29.7 |

Remarks)
N/A: The pattern is buried, and hence the dimension reduction was unmeasurable.
SA: sulfuric acid
AA: acetic acid
TSA: p-toluenesulfonic acid
BDSA: 1,3-benzendisulfonic acid
15NDSA: 1,5-naphthalenedisulfonic acid
27NDSA: 2,7-naphthalenedisulfonic acid

TABLE 4

| | Polymer | Concentration of sulfuric acid (wt %) | Dimension reduction Resist pattern 1 | Resist pattern 2 | Etching resistance |
|---|---|---|---|---|---|
| Com. 600 | PV600 | 0 | 37.4 | N/A | 42.0 |
| Com. 600A | PV600 | 10 | 37.1 | 24.4 | 46.1 |
| Com. 600B | PV600 | 20 | 37.4 | 22.4 | 49.0 |
| Ex. 601 | PV601 | 0 | 35.9 | 22.3 | 37.0 |
| Ex. 602 | PV602 | 0 | 36.7 | 25.4 | 35.4 |
| Ex. 611 | PV611 | 0 | 36.1 | 23.0 | 36.8 |
| Ex. 612 | PV612 | 0 | 36.4 | 25.1 | 35.2 |
| Ex. 621 | PV621 | 0 | 35.8 | 24.5 | 36.4 |
| Ex. 622 | PV622 | 0 | 36.6 | 26.3 | 35.5 |
| Ex. 623 | PV623 | 0 | 50.3 | 27.4 | 35.1 |

Remarks)
N/A: The pattern is burried, and hence the ÷imension reduction was unmeasurable.

The invention claimed is:

1. A composition for forming a superfine pattern, comprising pure water and a water-soluble resin represented by the following formula (1):

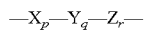  (1)

wherein

X, Y and Z are repeating units of

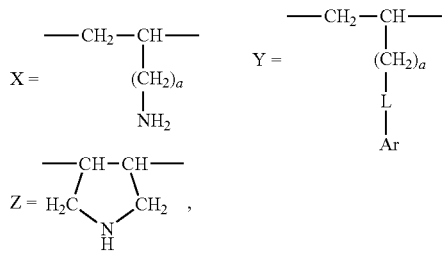

respectively;

p, q and r are numbers of polymerization ratios of said repeating units X, Y and Z, respectively, provided that they satisfy the conditions of $0.60 \leq p+r \leq 0.95$ and $0.05 \leq q \leq 0.40$ and that each repeating unit may combine with each other either randomly or to form a block;

a in said repeating unit X or Y is an integer of 0 or 1;

L in said repeating unit Y is a divalent linking group selected from the group consisting of
—N=CH—,
—NH—CHR$^0$—,
—NH—CH$_2$—CHR$^0$— and
—NH—CHR$^0$—CH$_2$—
where R$^0$ is selected from the group consisting of —H, —CH$_3$, —COOH, —CH$_2$COOH, —CH(CH$_3$)$_2$ and —COOC$_2$H$_5$;

Ar in said repeating unit Y is a group represented by the following formula:

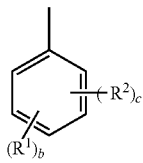

where b is an integer of 0 to 5; c is an integer of 0 to 5−b; R$^1$ is an organic group comprising elements selected from the group consisting of carbon, nitrogen, oxygen and fluorine; in the case where b is 2 or more, two R$^1$s may combine with each other to form a ring structure; and R$^2$ is an acid group selected from the group consisting of —COOH, —CH$_2$COOH, —CH(CH$_3$)COOH, —OCH$_2$COOH, —SO$_3$H and —OH;

said repeating unit Y contains at least one acid group; and each of said repeating units X and Y may be a combination of repeating units having different structures, respectively and further where r is non-zero and the Z unit is present.

2. The composition for forming a superfine pattern according to claim 1, wherein b is an integer from 1 to 5, R$^1$ is selected from the group consisting of alkyl, alkoxy, hydroxy alkyl, substituted amino, non-substituted amino, alkylether, alkylester, alkylamido, fluorine atom and fluorinated alkoxy.

3. The composition for forming a superfine pattern according to claim 1, wherein Ar is a group selected from the following groups:

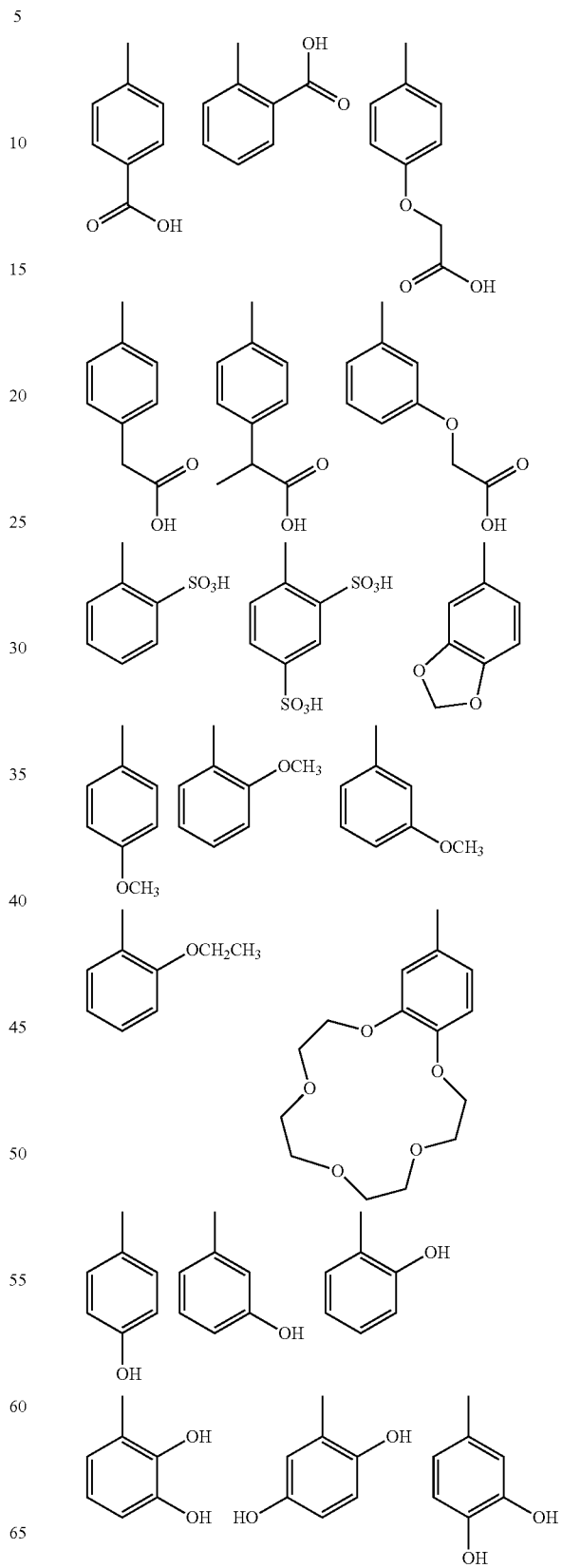

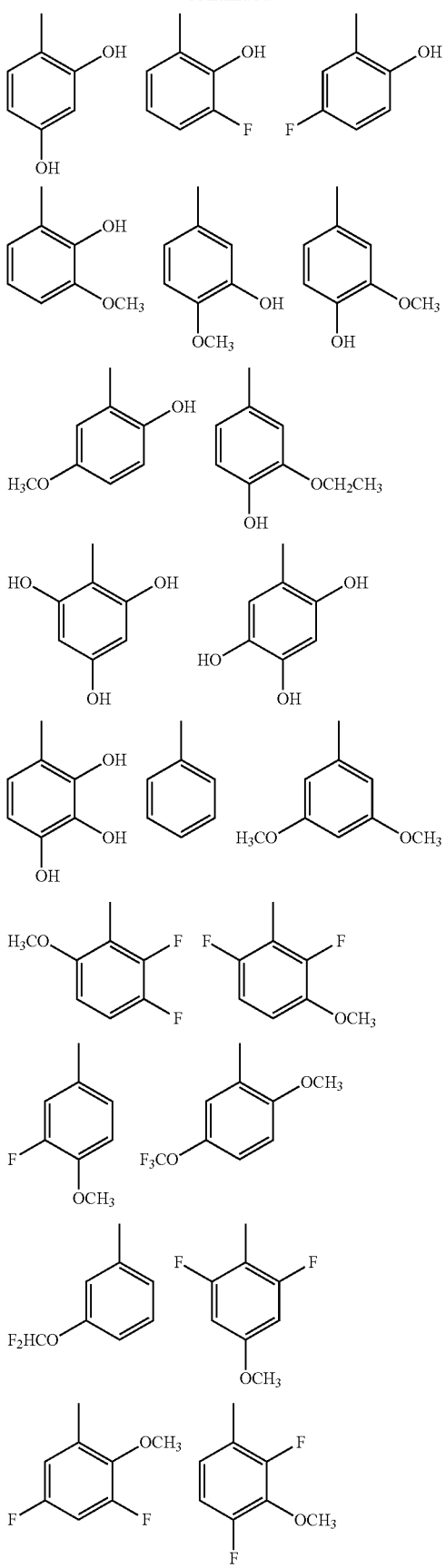
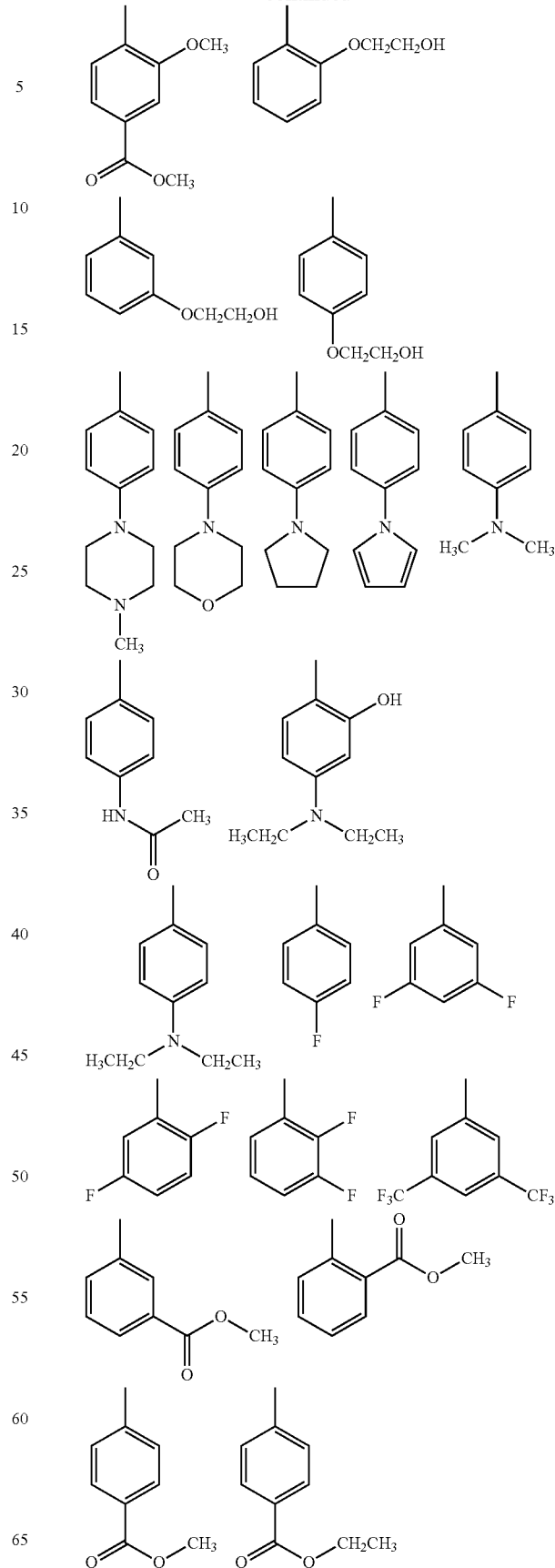

-continued

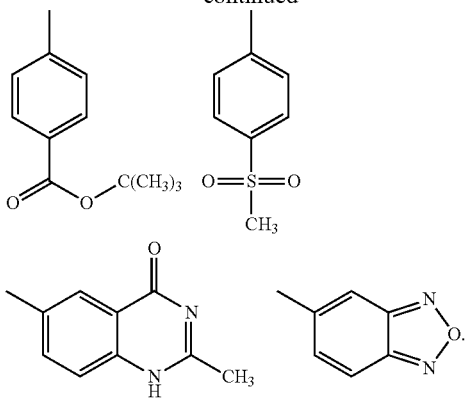

4. The composition for forming a superfine pattern according to claim 1, wherein said water-soluble resin has a weight average molecular weight of 3000 to 100000.

5. The composition for forming a superfine pattern according to claim 1, wherein said water-soluble resin is contained in an amount of 0.1 to 10 wt % based on the total weight of the composition.

6. A method for forming a superfine resist pattern, comprising the step of
treating a resist pattern after development with the composition for forming a superfine pattern according to claim 1, so as to reduce the effective size of the resist pattern after the development.

7. The method for forming a superfine resist pattern according to claim 6, further comprising the step of
washing said resist pattern with pure water immediately before or after the treatment with the composition for forming a superfine pattern.

8. A composition for forming a superfine pattern, comprising pure water, an acid and a water-soluble resin represented by the following formula (1'):

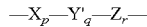 (1')

wherein
X, Y' and Z are repeating units of

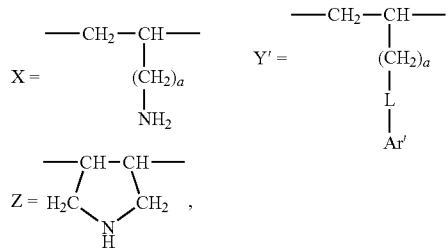

respectively;
p, q and r are numbers of polymerization ratios of said repeating units X, Y' and Z, respectively, provided that they satisfy the conditions of $0.60 \leq p+r \leq 0.95$ and $0.05 \leq q \leq 0.40$ and that each repeating unit may combine with each other either randomly or to form a block;
a in said repeating unit X or Y' is an integer of 0 or 1;
L' in said repeating unit Y' is a divalent linking group selected from the group consisting of
—N=CH—,
—NH—CHR$^{O'}$—,
—NH—CH$_2$—CHR$^{O'}$— and
—NH—CHR$^{O'}$—CH$_2$—
where R$^{O'}$ is selected from the group consisting of —H, —CH$_3$, —CH(CH$_3$)$_2$ and —COO$_2$H$_5$;

Ar' in said repeating unit Y' is a group represented by the following formula:

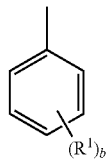

where b is an integer of 0 to 5; R$^1$ is an organic group comprising elements selected from the group consisting of carbon, nitrogen, oxygen and fluorine; and in the case where b is 2 or more, two R$^1$s may combine with each other to form a ring structure;

and each of said repeating units X and Y' may be a combination of repeating units having different structures, respectively and further where r is non-zero and the Z unit is present.

9. The composition for forming a superfine pattern according to claim 8, wherein b is an integer from 1 to 5, R$^1$ is selected from the group consisting of alkyl, alkoxy, hydroxy alkyl, substituted amino, non-substituted amino, alkylether, alkylester, alkylamido, fluorine atom and fluorinated alkoxy.

10. The composition for forming a superfine pattern according to claim 8, wherein Ar' is a group selected from the following groups:

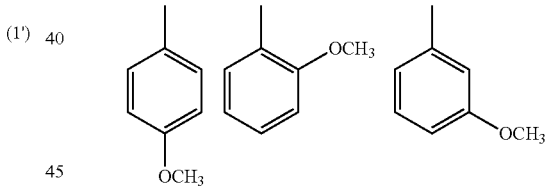
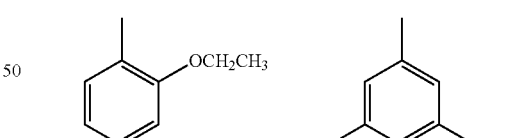
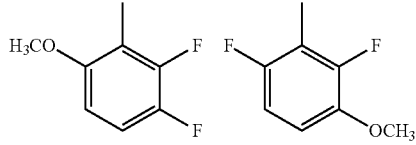
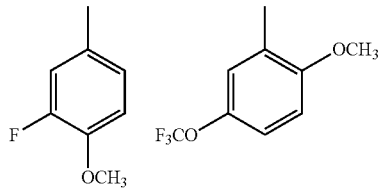

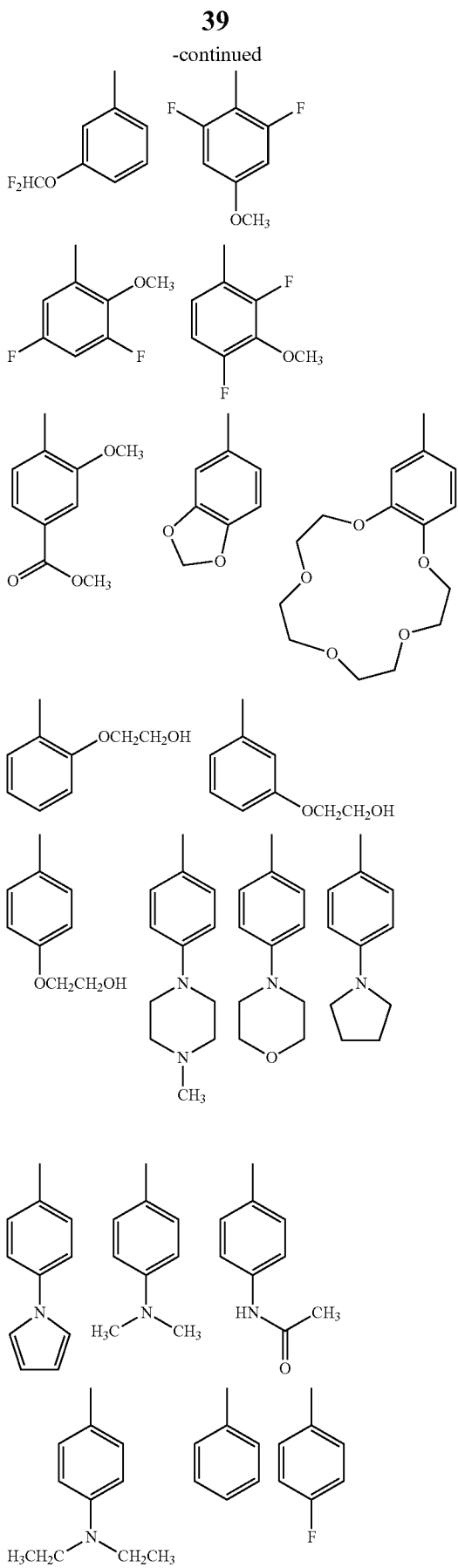

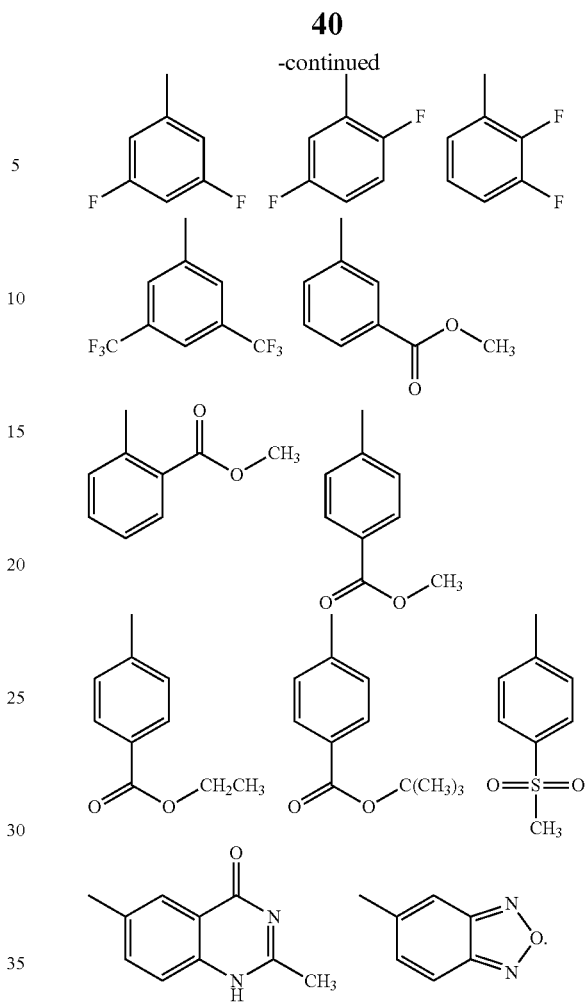

11. The composition for forming a superfine pattern according to claim 8, wherein said acid is selected from the group consisting of nitric acid, sulfuric acid, acetic acid, benzene-sulfonic acid, p-toluenesulfonic acid, 2-naphthalenesulfonic acid, 1,3-benzenedisulfonic acid, 1,5-naphthalenedisulfonic acid and 2,7-naphthalenedisulfonic acid.

12. A composition for forming a superfine pattern, comprising pure water and a water-soluble resin; wherein
said water-soluble resin is a product of the reaction of a backbone polymer represented by the following formula (2):

in which
$X^0$ and $Z^0$ are repeating units of

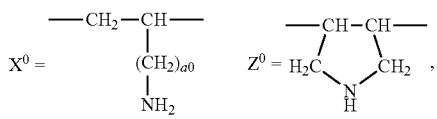

respectively;
p0 and r0 are numbers of polymerization ratios of said repeating units $X^0$ and $Z^0$, respectively, provided that they satisfy the conditions of $0.05 \leq p0 \leq 1$ and $0 \leq r0 \leq 0.95$ and that each repeating unit may combine with each other either randomly or to form a block;

a0 in said repeating unit $X^0$ is an integer of 0 or 1; and said repeating unit $X^0$ may be a combination of repeating units having different a0 integers;

with at least one side-chain forming compound represented by the following formula (3A) or (3B):

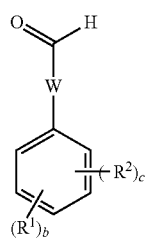
(3A)

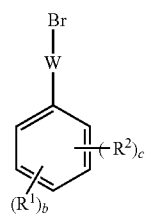
(3B)

in which b is an integer of 0 to 5; c is an integer of 0 to 5−b; W is a single bond or a divalent linking group selected from the group consisting of —$CHR^0$— and —$CHR^0$—$CH_2$— where $R^0$ is selected from the group consisting of —H, —$CH_3$, —$CH(CH_3)_2$, —COOH, —$CH_2COOH$ and —$COOC_2H_5$; $R^1$ is an organic group comprising elements selected from the group consisting of carbon, nitrogen, oxygen and fluorine; in the case where b is 2 or more, two $R^1$s may combine with each other to form a ring structure; $R^2$ is an acid group selected from the group consisting of —COOH, —$CH_2COOH$, —CH($CH_3$)COOH, —$OCH_2COOH$, —$SO_3H$ and —OH; and W or $R^1$ includes at least one acid group;

so that aromatic group-containing substituents derived from said side-chain forming compound are combined with 5 to 40% of nitrogen atoms in said backbone polymer and further where r0 is non-zero and the $Z^0$ unit is present.

13. The composition for forming a superfine pattern according to claim 12, wherein said side-chain forming compound is selected from the group consisting of:

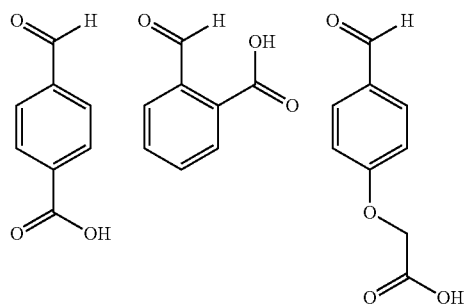

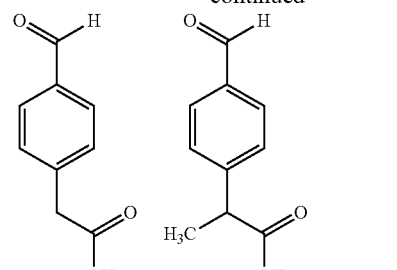

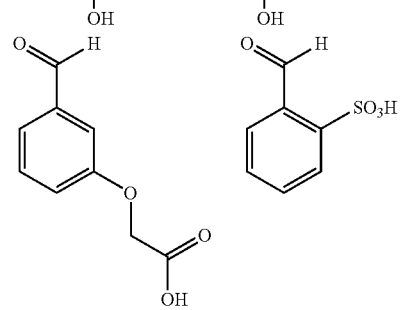

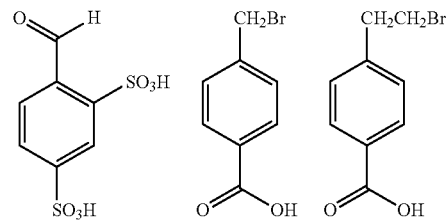

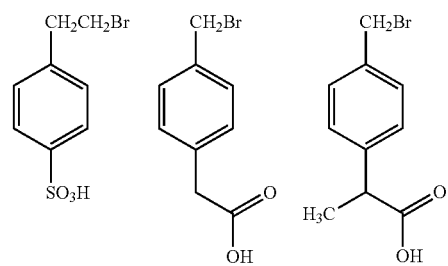

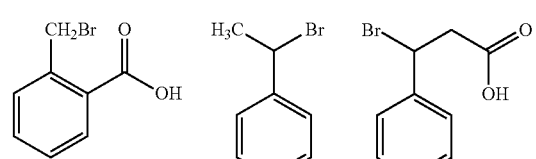

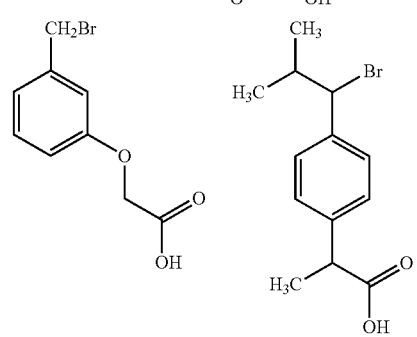

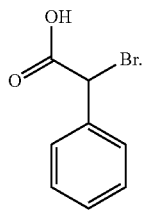

14. A composition for forming a superfine pattern, comprising pure water, an acid and a water-soluble resin;
wherein
said water-soluble resin is a product of the reaction of a backbone polymer represented by the following formula (2):

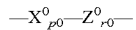 (2)

in which $X^0$ and $Z^0$ are repeating units of

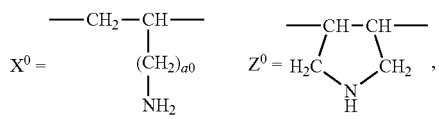

respectively;
p0 and r0 are numbers of polymerization ratios of said repeating units $X^0$ and $Z^0$, respectively, provided that they satisfy the conditions of $0.05 \leq p0 \leq 1$ and $0 \leq r0 \leq 0.95$ and that each repeating unit may combine with each other either randomly or to form a block;
a0 in said repeating unit $X^0$ is an integer of 0 or 1; and
said repeating unit $X^0$ may be a combination of repeating units having different a0 integers;
with at least one side-chain forming compound represented by the following formula (3A') or (3B'):

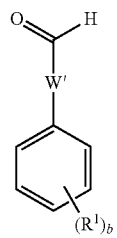 (3A')

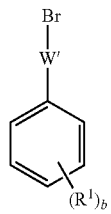 (3B')

in which b is an integer of 0 to 5; W' is a single bond or a divalent linking group selected from the group consisting of —CHR$^{0'}$— and —CHR$^{0'}$—CH$_2$— where R$^{0'}$ is selected from the group consisting of —H, —CH$_3$ and —COOC$_2$H$_5$; R$^1$ is an organic group comprising elements selected from the group consisting of carbon, nitrogen, oxygen and fluorine; and in the case where b is 2 or more, two R$^1$s may combine with each other to form a ring structure;
so that aromatic group-containing substituents derived from said side-chain forming compound are combined with 5 to 40% of nitrogen atoms in said backbone polymer and further where r0 is non-zero and the $Z^0$ unit is present.

15. The composition for forming a superfine pattern according to claim 14, wherein said side-chain forming compound is selected from the group consisting of:

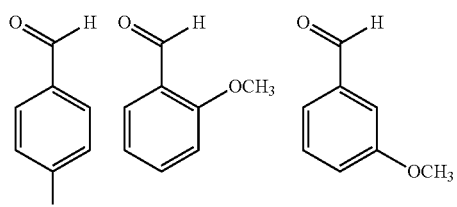

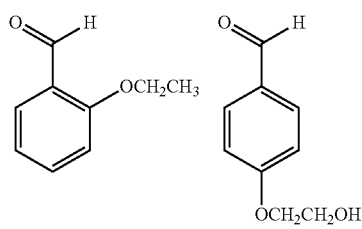

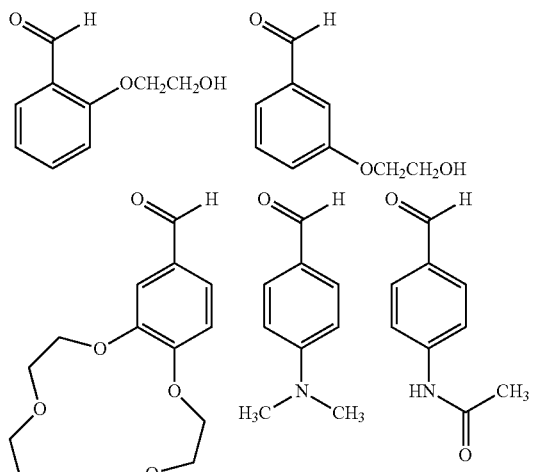

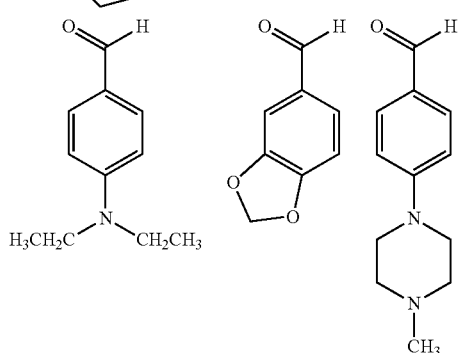

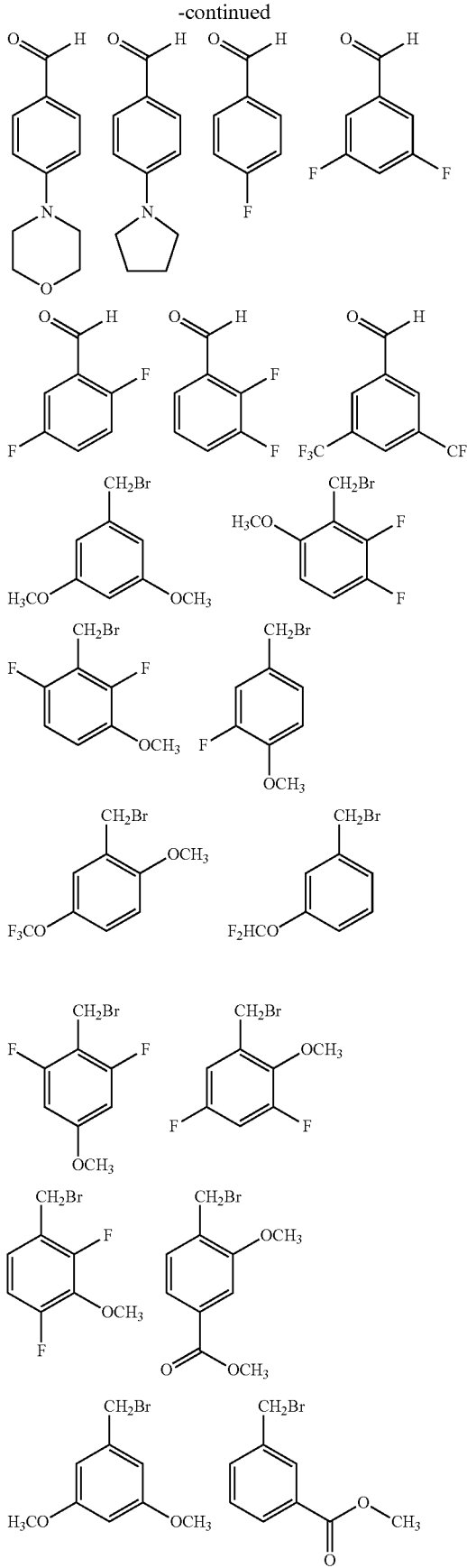

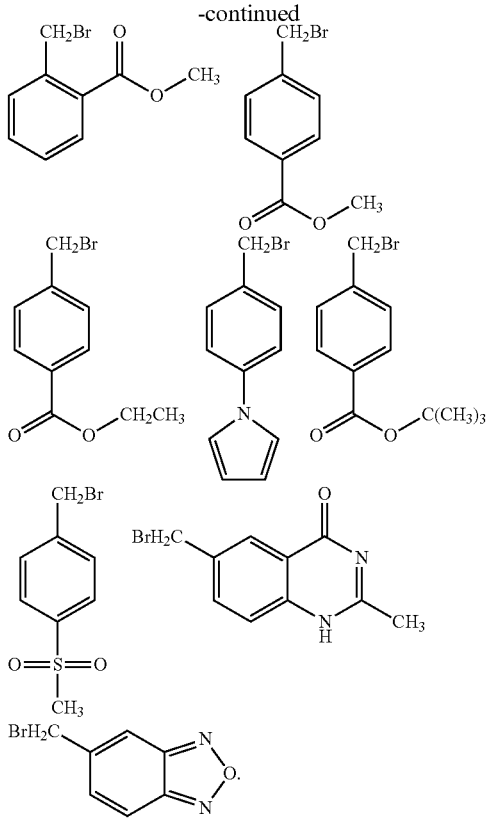

16. The composition for forming a superfine pattern according to claim 14, wherein said acid is selected from the group consisting of nitric acid, sulfuric acid, acetic acid, benzene-sulfonic acid, p-toluenesulfonic acid, 2-naphthalenesulfonic acid, 1,3-benzenedisulfonic acid, 1,5-naphthalenedisulfonic acid and 2,7-naphthalenedisulfonic acid.

17. A composition for forming a superfine pattern, comprising pure water and a water-soluble resin represented by the following formula (1):

$$-X_p-Y_q-Z_r-\qquad(1)$$

wherein
X, Y and Z are repeating units of

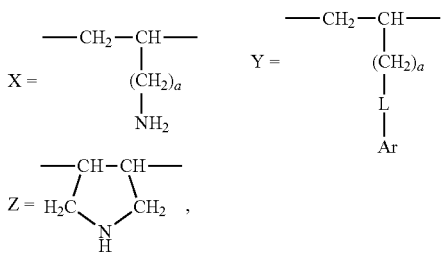

respectively;

p, q and r are numbers of polymerization ratios of said repeating units X, Y and Z, respectively, provided that they satisfy the conditions of $0.60 \leq p+r \leq 0.95$ and $0.05 \leq q \leq 0.40$ and that each repeating unit may combine with each other either randomly or to form a block;

a in said repeating unit X or Y is an integer of 0 or 1;

L in said repeating unit Y is a divalent linking group selected from the group consisting of —N=CH—,
—NH—CHR⁰—,
—NH—CH₂—CHR⁰— and
—NH—CHR⁰—CH₂—
where $R^0$ is selected from the group consisting of —H, —CH₃, —COOH, —CH₂COOH, —CH(CH₃)₂ and —COOC₂H₅;
Ar in said repeating unit Y is a group represented by the following formula:

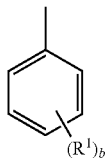

where b is an integer of 0 to 5; c is an integer of 0 to 5−b; $R^1$ is an organic group comprising elements selected from the group consisting of carbon, nitrogen, oxygen and fluorine; in the case where b is 2 or more, two $R^1$s may combine with each other to form a ring structure; and $R^2$ is an acid group selected from the group consisting of —COOH, —CH₂COOH, —CH(CH₃)COOH, —OCH₂COOH, —SO₃H and —OH;
said repeating unit Y contains at least one acid group; and
each of said repeating units X and Y may be a combination of repeating units having different structures, respectively and further wherein b is an integer from 1 to 5, $R^1$ is selected from the group consisting of alkyl, alkoxy, hydroxy alkyl, substituted amino, non-substituted amino, alkylether, alkylester, alkylamido, fluorine atom and fluorinated alkoxy.

18. A composition for forming a superfine pattern, comprising pure water and a water-soluble resin; wherein
said water-soluble resin is a product of the reaction of a backbone polymer represented by the following formula (2):

$$-X^0_{p0}-Z^0_{r0}- \quad (2)$$

in which
$X^0$ and $Z^0$ are repeating units of

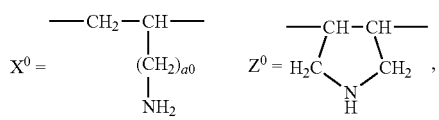

respectively;
p0 and r0 are numbers of polymerization ratios of said repeating units $X^0$ and $Z^0$, respectively, provided that they satisfy the conditions of $0.05 \leq p0 \leq 1$ and $0 \leq r0 \leq 0.95$ and that each repeating unit may combine with each other either randomly or to form a block;
a0 in said repeating unit $X^0$ is an integer of 0 or 1; and
said repeating unit $X^0$ may be a combination of repeating units having different a0 integers;
with
at least one side-chain forming compound represented by the following formula (3A) or (3B):

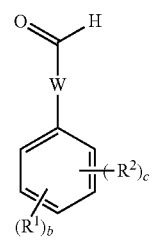

(3A)

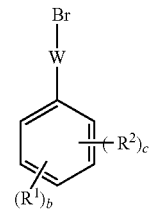

(3B)

in which b is an integer of 0 to 5; c is an integer of 0 to 5−b; W is a single bond or a divalent linking group selected from the group consisting of —CHR⁰— and —CHR⁰—CH₂— where $R^0$ is selected from the group consisting of —H, —CH₃, —CH(CH₃)₂, —COOH, —CH₂COOH and —COOC₂H₅; $R^1$ is an organic group comprising elements selected from the group consisting of carbon, nitrogen, oxygen and fluorine; in the case where b is 2 or more, two $R^1$s may combine with each other to form a ring structure; $R^2$ is an acid group selected from the group consisting of —COOH, —CH₂COOH, —CH(CH₃)COOH, —OCH₂COOH, —SO₃H and —OH; and W or $R^1$ includes at least one acid group;
so that aromatic group-containing substituents derived from said side-chain forming compound are combined with 5 to 40% of nitrogen atoms in said backbone polymer and further wherein said side-chain forming compound is selected from the group consisting of:

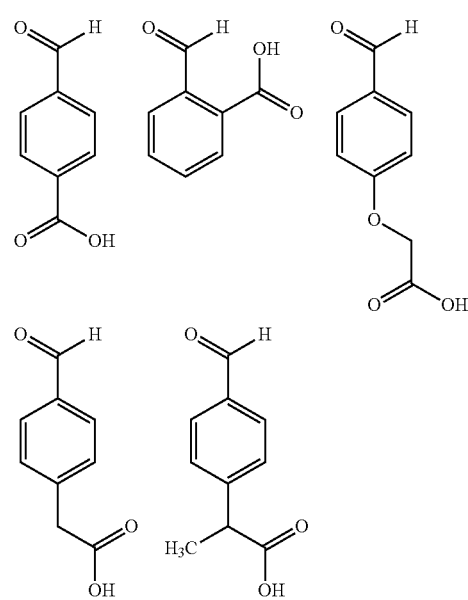

-continued
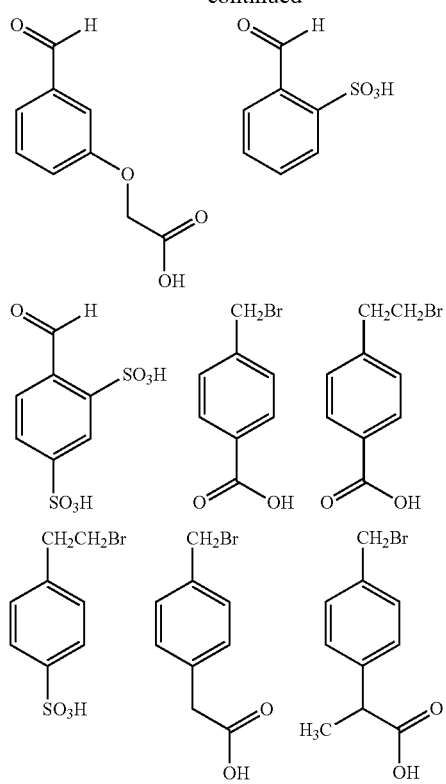
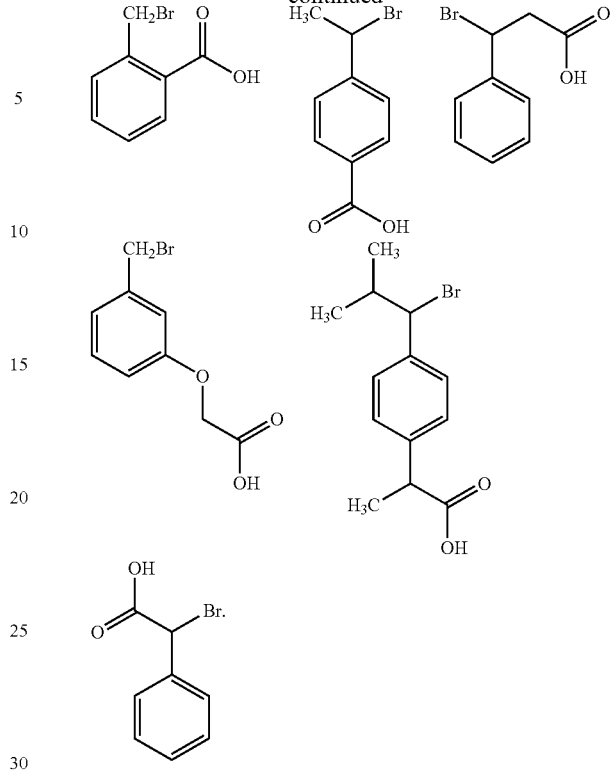
* * * * *